United States Patent [19]

Furuhashi et al.

[11] Patent Number: 5,894,184

[45] Date of Patent: Apr. 13, 1999

[54] DRIVE CIRCUIT FOR DRIVING A PIEZOELECTRIC TRANSFORMER CAPABLE OF DECREASING HEAT DEVELOPED FROM ELECTRONIC PARTS COMPOSING AN INVERTER CIRCUIT

[75] Inventors: Naoki Furuhashi; Hirokazu Takayoshi, both of Tokyo, Japan

[73] Assignee: NEC Corporation, Tokyo, Japan

[21] Appl. No.: 08/904,605

[22] Filed: Aug. 1, 1997

[30] Foreign Application Priority Data

Aug. 1, 1996 [JP] Japan .................. 8-203579

[51] Int. Cl.$^6$ ............................................. H01L 41/08
[52] U.S. Cl. ................................................. 310/316
[58] Field of Search ............................ 310/316–319, 310/366, 359; 318/116

[56] References Cited

U.S. PATENT DOCUMENTS 5,654,605  8/1997  Kawashima ................. 310/316
5,705,877  1/1998  Shimada ..................... 310/318
5,796,213  8/1998  Kawasaki ................. 310/316 X

FOREIGN PATENT DOCUMENTS 8-107678   4/1996   Japan .
8-275553  10/1996   Japan .
9-107684   4/1997   Japan .

*Primary Examiner*—Mark O. Budd
*Attorney, Agent, or Firm*—Young & Thompson

[57] ABSTRACT

In a drive circuit for a piezoelectric transformer that comprises an inverter circuit for supplying first and second primary electrodes of a piezoelectric transformer with a main drive voltage, a frequency control circuit having a normal frequency sweeping range, and a drive voltage control circuit for controlling input power of an input DC voltage supplied to the inverter circuit, an overvoltage protection circuit detects overvoltage in an output AC voltage from the piezoelectric transformer. On detection of the overvoltage in the output AC voltage, the overvoltage protection circuit supplies the frequency control circuit with an additional reset signal and a switching signal, thereby making the frequency control circuit switch the normal frequency sweeping range to a provisional frequency sweeping range included in the normal frequency sweeping range. The switching signal may be supplied to the drive voltage control circuit to make the drive voltage control circuit decrease the input power of the input DC voltage.

21 Claims, 21 Drawing Sheets

FIG. 7A PRIOR ART
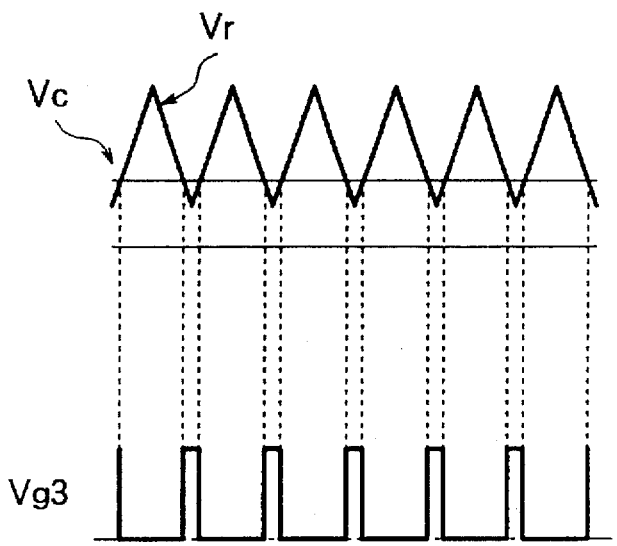
FIG. 7B PRIOR ART $V_{g3}$
FIG. 7C PRIOR ART $V_{g1}$
FIG. 7D PRIOR ART $V_{g2}$
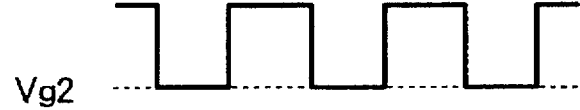
FIG. 7E PRIOR ART $V_{d1}$
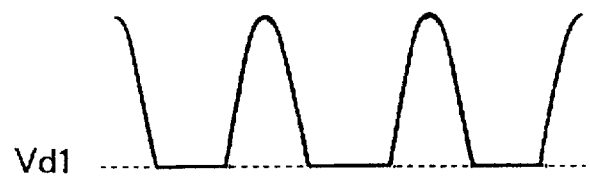
FIG. 7F PRIOR ART $V_{d2}$

$V_{g3}$ $V_{g1}$ $V_{g2}$ $V_{d1}$ $V_{d2}$

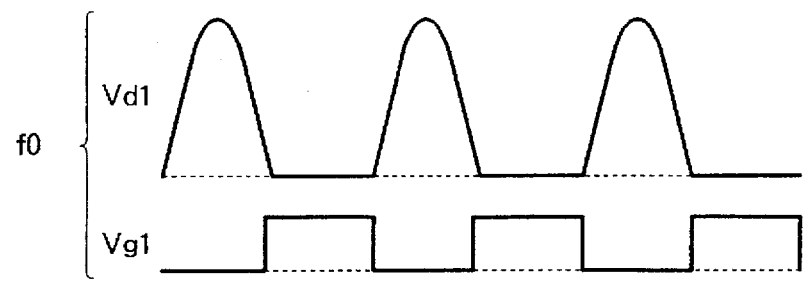
FIG. 9A f0
PRIOR ART
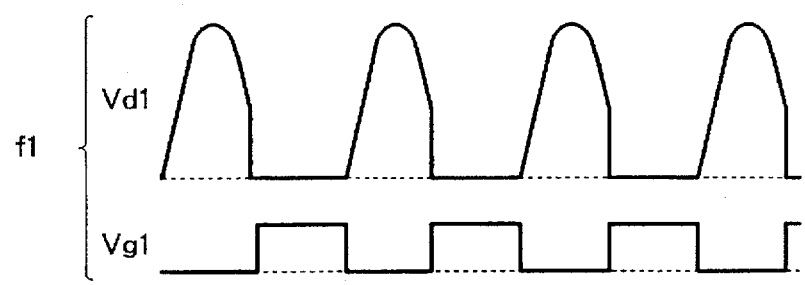
FIG. 9B f1
PRIOR ART
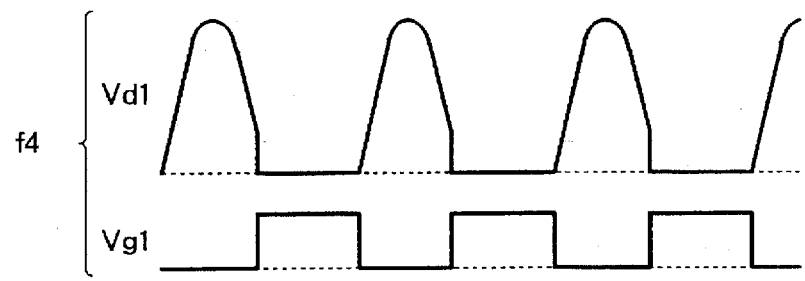
FIG. 9C f4

FIG. 13A  Vn 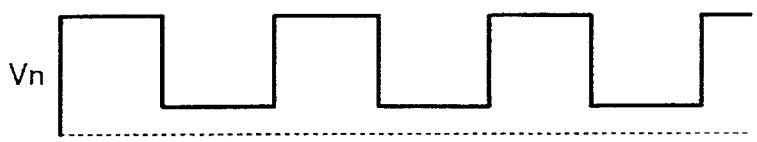
FIG. 13B  Vr 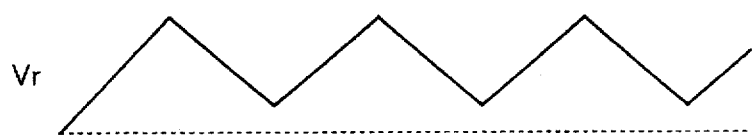
FIG. 13C  Vc 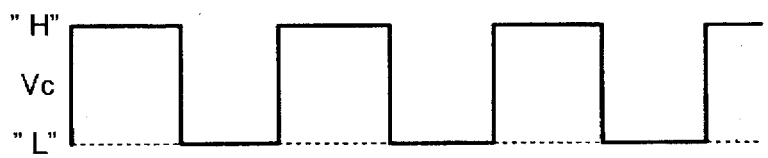
FIG. 13D  Vvco 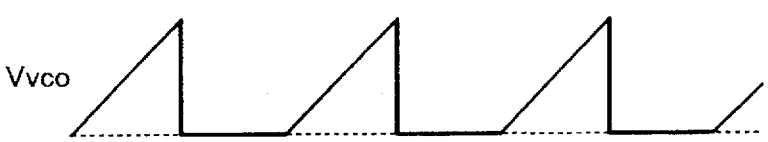

DRIVE CIRCUIT FOR DRIVING A PIEZOELECTRIC TRANSFORMER CAPABLE OF DECREASING HEAT DEVELOPED FROM ELECTRONIC PARTS COMPOSING AN INVERTER CIRCUIT

BACKGROUND OF THE INVENTION

This invention relates to a drive circuit for driving a piezoelectric transformer which generates an AC voltage using a piezoelectric material and, in particular, to a drive method in an open state of a load or a state where a cold-cathode tube serving as the load does not light up because the cold-cathode tube has a high impedance.

In general, the piezoelectric transformer is an element which comprises a piezoelectric material having first and second primary electrodes and a secondary electrode. The piezoelectric transformer has a resonance frequency. The piezoelectric transformer is resonated by applying an AC voltage having the resonance frequency to the first and the second primary electrodes and the piezoelectric transformer takes a generation voltage due to mechanical vibration out of the secondary electrode. Inasmuch as the piezoelectric transformer is miniaturized and thinned in comparison with an electromagnetic transformer, the piezoelectric transformer is used as a main transformer for use in a back light electric source for a liquid crystal display.

A conventional drive circuit for the piezoelectric transformer is proposed in Japanese Patent Application No. Hei 7-69,207 which is published as Japanese Unexamined Patent Publication of Tokkai No. Hei 8-275,553 or JP-A 8-275,553 of Oct. 18, 1996 after making an application for the instant Japanese Patent Application No. Hei 8-203,579 of Aug. 1, 1996.

According to JP-A 8-275,553, the drive circuit comprises an inverter circuit and a frequency control circuit. The frequency control circuit is supplied with, as a feedback current, a load current from a load. The load may be a cold-cathode tube. Response to the feedback current, the frequency control circuit supplies the inverter circuit with a frequency control signal indicative of a drive frequency for the piezoelectric transformer. The inverter circuit is supplied with a DC power source voltage as an input DC voltage directly. Response to the frequency control signal, the inverter circuit converts the input DC voltage into a main drive voltage. The main drive voltage is supplied to the first and the second primary electrodes of the piezoelectric transformer as an input AC voltage. Responsive to the input AC voltage, the piezoelectric transformer carries out resonance operation to produce an output AC voltage from a secondary electrode thereof. The output AC voltage is supplied to the load.

The frequency control circuit has a normal frequency sweeping range which is defined between a normal upper limit frequency and a normal lower limit frequency. The normal frequency sweeping range includes the resonance frequency of the piezoelectric transformer. The frequency control circuit sweeps the drive frequency within the normal frequency sweep range. Responsive to a reset signal, the frequency control circuit is reset to shift the drive frequency from the normal lower limit frequency to the normal upper limit frequency.

Another conventional drive circuit for the piezoelectric transformer is proposed in Japanese Patent Application No. Hei 6-241,049 which is published as Japanese Unexamined Patent Publication of Tokkai No. Hei 8-107,678 or JP-A 8-107,678 of Apr. 23, 1996 prior to making the application for the instant Japanese Patent Application No. Hei 8-203, 579 of Aug. 1, 1996.

According to JP-A 8-107,678, the drive circuit prevents destruction of the piezoelectric transformer when the output AC voltage of the piezoelectric transformer is to high. The drive circuit comprises a driving circuit, a load-current comparing circuit, an output-voltage comparing circuit, and a frequency sweeping oscillator. The load-current comparing circuit converts load current into a DC voltage and then compares the DC voltage with a load-current reference voltage which corresponds to a desired load-current value. The load-current comparing circuit produces a load-current comparison result signal which is supplied to the frequency sweeping oscillator. On the basis of the load-current comparison result signal, the frequency sweeping oscillator determines a direction in a frequency sweeping of the drive frequency. The frequency sweeping oscillator has upper and lower limit frequencies for the frequency sweeping. The output-voltage comparing circuit divides and rectifies the output AC voltage from the piezoelectric transformer to produce a divided-rectified voltage and then compares the divided-rectified voltage with an output-voltage reference voltage which corresponds to a desired output AC voltage. The output-voltage comparing circuit produces an output-voltage comparison result signal which is supplied to the frequency sweeping oscillator. On the basis of the output-voltage comparison result signal, the frequency sweeping oscillator determines the direction in the frequency sweeping of the drive frequency. The driving circuit is connected to the first and the second primary electrodes of the piezoelectric transformer. Responsive to a frequency control signal indicative of the drive frequency, the driving circuit drives the piezoelectric transformer.

Still another conventional drive circuit for the piezoelectric transformer is proposed in Japanese Patent Application No. Hei 7-264,081 which is published as Japanese Unexamined Patent Publication of Tokkai No. Hei 9-107,684 or JP-A 9-107,684 of Apr. 22, 1997 after making the application for the instant Japanese Patent Application No. Hei 8-203,579 of Aug. 1, 1996.

According to JP-A 9-107,684, the drive circuit is operable at a high efficiency in a wide input DC voltage range. The drive circuit comprises not only the inverter circuit and the frequency control circuit but also a drive voltage control circuit and a dimmer circuit. The DC power source voltage is supplied to the inverter circuit via the drive voltage control circuit. In other words, the drive voltage control circuit supplies the inverter circuit with an input DC voltage having controllable input power. The inverter circuit includes first and second subsidiary transformers supplied with first and second subsidiary drive voltages, respectively. The first subsidiary drive voltage is supplied to the drive voltage control circuit. The frequency control circuit includes a voltage controlled oscillator which oscillates a chopping wave signal as well as the frequency control signal. The chopping wave signal is supplied to the drive voltage control circuit. Responsive to the chopping wave signal and the first subsidiary drive voltage, the drive voltage control circuit controls the input power of the input DC voltage. Responsive to a dimmer voltage, the dimmer circuit produces a dimmer control signal which is supplied to the drive voltage control circuit.

However, the above-mentioned conventional drive circuits have two problems as follows. A first problem is that electronic parts composing the inverter circuit develop heat in a case where the piezoelectric transformer is put into an abnormal state or has high impedance. A second problem is that it is in design difficult to make the normal upper limit frequency of the voltage controlled oscillator shift downward. This is because the drive frequency must be laid in a frequency sweeping range of the frequency control circuit under all conditions. To resolve the first problem must shift the normal upper limit frequency to a lower frequency. On the contrary, to resolve the second problem must shift the normal upper limit frequency to a higher frequency. Accordingly, the first and the second problems conflict with each other and it result in difficult to design the drive circuit for the piezoelectric transformer. That is, the above-mentioned conventional drive circuits do not take into account in the case where the piezoelectric transformer is put into the abnormal state.

SUMMARY OF THE INVENTION

It is therefore an object of this invention to provide a drive circuit which is capable of decrease heat developed from electronic parts composing an inverter circuit although a piezoelectric transformer is put into an abnormal state.

It is another object of this invention to provide a drive circuit of the type described, which is capable of light up a cold-cathode tube in stable under all conditions.

Other objects of this invention will become clear as the description proceeds.

On describing the gist of this invention, it is possible to understand that a drive circuit is for driving a piezoelectric transformer acting as a main transformer. The piezoelectric transformer has a resonance frequency. The piezoelectric transformer has first and second primary electrodes supplied with an input AC voltage. The piezoelectric transformer converts the input AC voltage into an output AC voltage by the use of piezoelectric effect. The piezoelectric transformer has a secondary electrode for supplying the output AC voltage to a load.

According to a first aspect of this invention, the above-understood drive circuit comprises an inverter circuit which is supplied with an input DC voltage having controllable input power and with a frequency control signal. The inverter circuit is connected to the first and the second primary electrodes of the piezoelectric transformer. The inverter circuit converts the input DC voltage into a main drive voltage in response to the frequency control signal. The inverter circuit supplies the first and the second primary electrodes of the piezoelectric transformer with the main drive voltage as the input AC voltage. The inverter circuit includes first and second subsidiary transformers supplied with first and second subsidiary drive voltages, respectively. Supplied with a load current flowing in the load as a feedback current, a frequency control circuit controls a drive frequency for the piezoelectric transformer in response to the feedback current. The frequency control circuit has a normal frequency sweeping range defined between a normal upper limit frequency and a normal lower limit frequency. The normal frequency sweeping range includes the resonance frequency. The frequency control circuit sweeps the drive frequency within the normal frequency sweeping range. Responsive to a reset signal, the frequency control circuit is reset to shift the drive frequency from the normal lower limit frequency to the normal upper limit frequency. The frequency control circuit produces the frequency control signal and a chopping wave signal which indicate the drive frequency. A drive voltage control circuit is supplied with a DC power source voltage and is connected to the inverter circuit and to the frequency control circuit. Responsive to the chopping wave signal and the first subsidiary drive voltage, the drive voltage control circuit controls the input power of the input DC voltage so as to keep the first subsidiary drive voltage at a predetermined peak value. An overvoltage protection circuit is connected to the secondary electrode of the piezoelectric transformer and to the frequency control circuit. The overvoltage protection circuit detects overvoltage in the output AC voltage. On detection of the overvoltage in the output AC voltage, the overvoltage protection circuit supplies the frequency control circuit with an additional reset signal and a switching signal. Thereby the frequency control circuit switches the normal frequency sweeping range to a provisional frequency sweeping range which is defined between a provisional lower limit frequency higher than the resonance frequency and a provisional upper limit frequency lower than the normal upper limit frequency.

According to a second aspect of this invention, the afore-understood drive circuit comprises an inverter circuit supplied with an input DC voltage having controllable input power and with a frequency control signal. The inverter circuit is connected to the first and the second primary electrodes of the piezoelectric transformer. Responsive to the frequency control signal, the inverter circuit converts the input DC voltage into a main drive voltage. The inverter circuit supplies the first and the second primary electrodes of the piezoelectric transformer with the main drive voltage as the input AC voltage. The inverter circuit includes first and second subsidiary transformers supplied with first and second subsidiary drive voltages, respectively. A frequency control circuit is supplied with a load current flowing in the load as a feedback current. Responsive to the feedback current, the frequency control circuit controls a drive frequency of the piezoelectric transformer. The frequency control circuit has a normal frequency sweeping range which is defined between a normal upper limit frequency and a normal lower limit frequency. The normal frequency sweeping range includes the resonance frequency. The frequency control circuit sweeps the drive frequency within the normal frequency sweeping range. Responsive to a reset signal, the frequency control circuit is reset to shift the drive frequency from the normal lower limit frequency to the normal upper limit frequency. The frequency control circuit produces the frequency control signal and a chopping wave signal which indicate the drive frequency. A drive voltage control circuit is supplied with a DC power source voltage and is connected to the inverter circuit and to the frequency control circuit. Responsive to the chopping wave signal and the first subsidiary drive voltage, the drive voltage control circuit controls the input power of the input DC voltage so as to keep the first subsidiary drive voltage at a predetermined peak value. An overvoltage protection circuit is connected to the secondary electrode of the piezoelectric transformer, to the frequency control circuit, and to the drive voltage control circuit. The overvoltage protection circuit detects overvoltage in the output AC voltage. On detection of the overvoltage in the output AC voltage, the overvoltage protection circuit supplies the frequency control circuit and the drive voltage control circuit with an additional reset signal and a switching signal, respectively. Thereby, the frequency control circuit switches from the normal frequency sweeping range to a provisional frequency sweeping range which is defined between the normal upper limit frequency and a provisional lower limit frequency higher than the resonance frequency and the drive voltage control circuit decreases the input power of the input DC voltage.

According to a third aspect of this invention, the above-understood drive circuit comprises an inverter circuit which supplied with an input DC voltage having controllable input power and with a frequency control signal. The inverter circuit is connected to the first and the second primary electrodes of said piezoelectric transformer. Responsive to the frequency control signal, the inverter circuit converts the input DC voltage into a main drive voltage. The inverter circuit supplies the first and the second primary electrodes of said piezoelectric transformer with the main drive voltage as the input AC voltage. The inverter circuit includes first and second subsidiary transformers supplied with first and second subsidiary drive voltages, respectively. A frequency control circuit is supplied with a load current flowing in the load as a feedback current. Responsive to the feedback current, the frequency control circuit controls a drive frequency of the piezoelectric transformer. The frequency control circuit has a normal frequency sweeping range which is defined between a normal upper limit frequency and a normal lower limit frequency. The normal frequency sweeping range includes the resonance frequency. The frequency control circuit sweeps the drive frequency within the normal frequency sweeping range. Responsive to a reset signal, the frequency control circuit is reset to shift the drive frequency from the normal lower limit frequency to the normal upper limit frequency. The frequency control circuit produces the frequency control signal and a chopping wave signal which indicate the drive frequency. A drive voltage control circuit is supplied with a DC power source voltage and is connected to the inverter circuit and to the frequency control circuit. Responsive to the chopping wave signal and the first subsidiary drive voltage, the drive voltage control circuit controls the input power of the input DC voltage so as to keep the first subsidiary drive voltage at a predetermined peak value. An overvoltage protection circuit is connected to the secondary electrode of the piezoelectric transformer, to the frequency control circuit, and to the drive voltage control circuit. The overvoltage protection circuit detects overvoltage in the output AC voltage. On detection of the overvoltage in the output AC voltage, the overvoltage protection circuit supplies the frequency control circuit with both of an additional reset signal and a switching signal and supplies the drive voltage control circuit with the switching signal. Thereby, the frequency control circuit switches from the normal frequency sweeping range to a provisional frequency sweeping range which is defined between a provisional upper limit frequency lower than the normal upper limit frequency and a provisional lower limit frequency higher than the resonance frequency and the drive voltage control circuit decreases the input power of the input DC voltage.

BRIEF DESCRIPTION OF THE DRAWINGS

FIGS. 7A through 7F are time charts for use in describing operation of the drive circuit illustrated in FIG. 6 in a case where a rectified voltage is relatively low;

FIGS. 9A through 9C show waveforms of a first drain voltage with a first clock signal in cases where a drive frequency are equal to a prescribed frequency, a normal upper limit frequency, and a provisional upper limit frequency, respectively;

FIGS. 13A through 13D are time charts for use in describing operation of the voltage controlled oscillator illustrated in FIG. 12;

DESCRIPTION OF THE PREFERRED EMBODIMENTS

Figure 1:
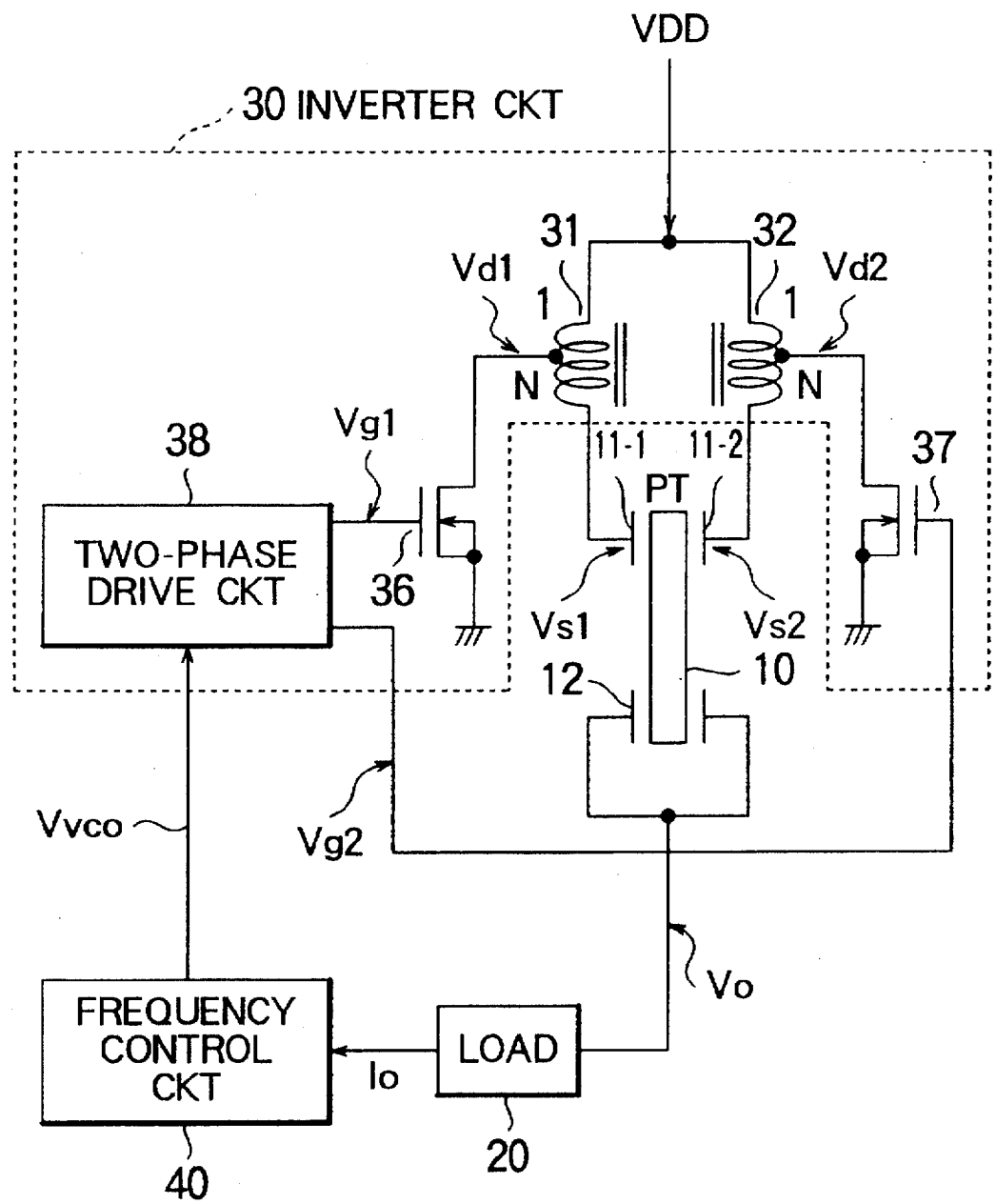
FIG. 1 shows a block diagram of a conventional drive circuit for a piezoelectric transformer.

Referring to FIG. 1, a first conventional drive circuit for a piezoelectric transformer (PT) will be described in order to facilitate an understanding of the present invention. The piezoelectric transformer 10 has first and second primary electrodes 11-1 and 11-2, and second secondary electrode 12. The first and the second primary electrodes 11-1 and 11-2 are supplied with an input AC voltage in the manner which will later become clear. The piezoelectric transformer 10 converts the input AC voltage in an output AC voltage using piezoelectric effect. The output AC voltage Vo is produced by the secondary electrode 12. The output AC voltage Vo is supplied from the secondary electrode 12 to a load 20. Responsive to the output AC voltage Vo, an output AC current Io flows in the load 20. At any rate, the piezoelectric transformer 10 serves as a main transformer.

The illustrated drive circuit comprises an inverter circuit 30 and a frequency control circuit 40.

The inverter circuit 30 is supplied with a DC power source voltage $V_{DD}$ from a DC power source (not shown). The inverter circuit 30 is connected to the first and the second primary electrodes 11-1 and 11-2 of the piezoelectric transformer 10. The inverter circuit 30 is supplied with a frequency control signal $V_{vco}$ from the frequency control circuit 40 in the manner which will later become clear. Responsive to the frequency control signal $V_{vco}$, the inverter circuit 30 converts the DC power source voltage $V_{DD}$ into a main drive voltage. The main drive voltage is suppled to the first and the second primary electrodes 11-1 and 11-2 of the piezoelectric transformer 10 as the input AC voltage.

The inverter circuit 30 comprises first and second auto-transformers 31 and 32, first and second switching transistors 36 and 37, and a two-phase drive circuit 38. The first and the second auto-transformers 31 and 32 act as first and second subsidiary transformers each of which belongs to to the group of an electromagnetic transformer. The first and the second auto-transformers 31 and 32 have first and second a primary windings and first and second secondary windings, respectively, which have turns ratio of N. The first and the second auto-transformers 31 and 32 have first and second primary terminals, first and second secondary terminals, and first and second intermediate terminals, respectively. The first and the second primary terminals of the first and the second auto-transformers 31 and 32 are connected to the DC power source in common. The first and second secondary terminals of the first and the second auto-transformers 31 and 32 are connected to the first and the second primary electrodes 11-1, or 11-2 of the piezoelectric transformer 10, respectively.

In the example being illustrated, each of the first and the second switching transistors 36 and 37 is composed of an N-channel field effect transistor (FET) which has drain, source, and gate electrodes. The drain electrode of the first switching transistor 36 is connected to the first intermediate terminal of the first auto-transformer 31 while the drain electrode of the second switching transistor 37 is connected to the second intermediate terminal of the second auto-transformer 32. That is, each drain electrode of the first and the second switching transistors 36 and 37 serves as an output terminal. The source electrodes of the first and the second auto-transistors 36 and 37 are grounded. The gate electrodes of the first and the second auto-transistors 36 and 37 are connected to the two-phase drive circuit 38.

The two-phase drive circuit 38 is supplied with the frequency control signal $V_{vco}$ from the frequency control circuit 40. Responsive to the frequency control signal $V_{vco}$, the two-phase drive circuit 38 alternately drives the first and the second switching transistors 36 and 37 using first and second clock signals Vg1 and Vg2 in the manner which will later be described.

The frequency control circuit 40 detects the output AC current Io which flows in the load 20. The load 20 may be a cold-cathode tube. In the manner which will later be described, the frequency control circuit 40 generates the frequency control signal $V_{vco}$ in response to the output AC current Io.

With this structure, it is possible to supply the load 20 with the output AC voltage Vo in stable although the DC power source voltage $V_{DD}$ changes.

Description will proceed to operation of the drive circuit illustrated in FIG. 1. The first and the second switching transistors 36 and 37 are alternately put into an ON state in response to the first and the second clock signals Vg1 and Vg2 produced by the two-phase drive circuit 38. The first and the second clock signals Vg1 and Vg2 have reversed phase each other. When the first switching transistor 36 is put into the ON state, the DC power source allows current to flow through the first primary winding of the first auto-transformer 31 to charge the current as energy of magnetic field. When the first switching transistor 36 is put into an OFF state, the first auto-transformer 36 discharges the energy of magnetic field to generate a high AC voltage having an amplitude higher than that of the DC power source voltage $V_{DD}$. Likewise, when the second switching transistor 37 is put into the ON state, the DC power source allows current to flow through the second primary winding of the second auto-transformer 32 to charge the current as energy of magnetic field. When the second switching transistor 37 is put into an OFF state, the second auto-transformer 37 discharges the energy of magnetic field to generate a high AC voltage having an amplitude higher than that of the DC power source voltage $V_{DD}$.

Figure 2A:
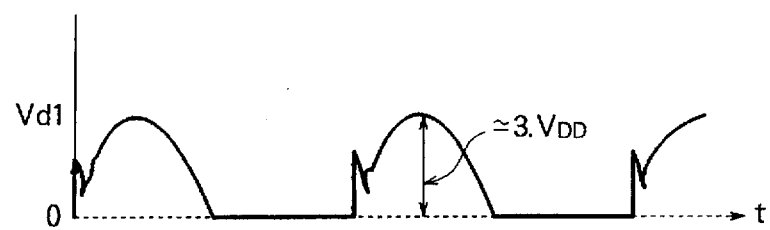
FIGS. 2A through 2D are time charts for use in describing operation of first and second auto-transformers used in an inverter circuit of the drive circuit illustrated in FIG. 1.
Figure 2B:
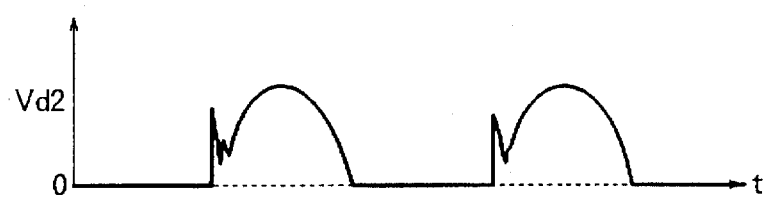
Figure 2C:
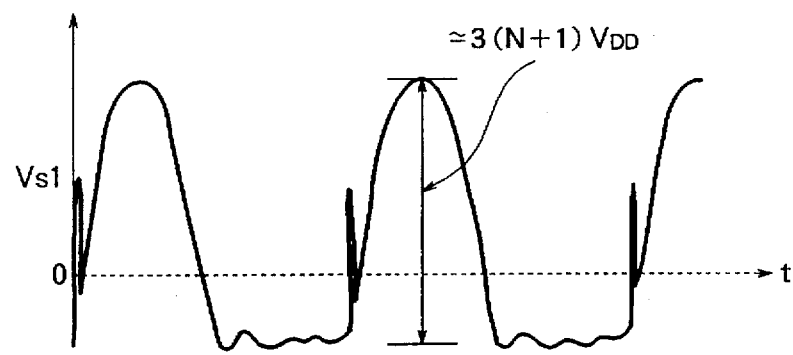
Figure 2D:
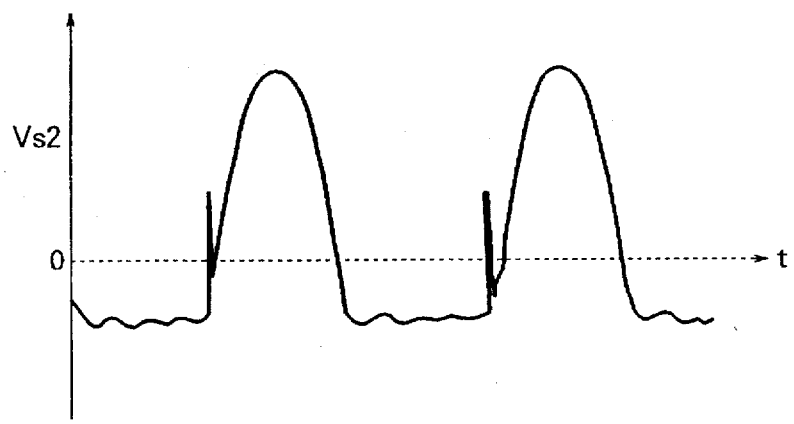

FIG. 2A shows a waveform of a first drain voltage Vd1 which is supplied from the drain electrode of the first switching transistor 36 to the first intermediate terminal of the first auto-transformer 31. The first drain voltage Vd1 is called a first subsidiary drive voltage because the first auto-transformer 31 serves as the first subsidiary transformer. FIG. 2B shows a waveform of a second drain voltage Vd2 which is supplied from the drain electrode of the second switching transistor 37 to the second intermediate terminal of the second auto-transformer 31. Likewise, the second drain voltage Vd2 is referred to a second subsidiary drive voltage because the second auto-transformer 32 is operable as the second subsidiary transformer. FIG. 2C shows a waveform of a first input voltage Vs1 which is supplied from the second secondary terminal of the first auto-transformer 31 to the first primary electrode 11-1 of the piezoelectric transformer 10. FIG. 2D shows a waveform of a second input voltage Vs2 which is supplied from the secondary terminal of the second auto-transformer 32 to the second primary electrode 11-2 of the piezoelectric transformer 10.

As shown in FIGS. 2A and 2B, each of the first and the second drain voltages Vd1 and Vd2 has a half wave rectified waveform of a peak voltage equal to about three times as large as the amplitude of the DC power source voltage $V_{DD}$. The second drain voltage Vd2 is shifted 180° away from the first drain voltage Vd1. In addition, each of first and the second drain voltages Vd1 and Vd2 has zero volt during a time duration which is a half times as large as a resonance period of the piezoelectric transformer 10.

As shown in FIGS. 2C and 2D, each of the first and the second input voltages Vs1 and Vs2 has a voltage peak which is equal to about 3X(N+1) times as large as the amplitude of of the DC power source voltage $V_{DD}$. The second input voltage Vs2 is shifted 180° away from the first input voltage Vs1. It will be assumed as follows. A combination of the piezoelectric transformer 10 and the load 20 has an equivalent input capacitance $C_L$. Each of the first and the second primary windings of the first and the second auto-transformers 31 and 32 has a primary inductance Lp while each of first and the second the secondary windings of the first and the second auto-transformers 31 and 32 has a secondary inductance Ls. In this event, each of the first and the second input voltages Vs1 and Vs2 has a voltage resonance waveform which is defined by the equivalent input capacitance $C_L$, the primary inductance Lp, and the secondary inductance Ls.

As described above, the auto-transformer has a type of the electromagnetic transformer. Other type of the electromagnetic transformer is called a general or normal electromagnetic transformer. As is well known in the art, the auto-transformer has a step-up ratio which higher than that of the normal electromagnetic transformer having the same winding ratio. In other words, in order to obtain the same step-up ratio, the auto-transformer may have less winding ratio in comparison with the normal electromagnetic transformer. Accordingly, the auto-transformer is advantageous in that the subsidiary transformer is miniaturized and is made thinner.

Inasmuch as the first and the second input voltages Vs1 and Vs2 are alternately supplied to the first and the second primary electrodes 11-1 and 11-2 of the piezoelectric transformer 10, the main drive voltage having an equivalently sinusoidal waveform makes the piezoelectric transformer 10 oscillate. Accordingly, the second secondary electrode 12 of the piezoelectric transformer 10 generates the output AC voltage Vo which is M times as large as the main drive voltage, where M represents a step-up ratio of the piezoelectric transformer 10 that is defined by the geometry of the piezoelectric transformer 10. The output AC voltage Vo is applied to the load 20 and then the output AC current or a load current Io flows in the load 20. The load current Io is supplied or fed back to the frequency control circuit 40 as a feedback current. Responsive to the feedback current Io, the frequency control circuit 40 generates the frequency control signal $V_{vco}$ indicative of a drive frequency that is supplied to the two-phase drive circuit 38. Until the feedback current Io has a predetermined average value, the frequency control circuit 40 sweeps the drive frequency. When the feedback current Io has the predetermined effective value, the frequency control circuit 40 stops a frequency sweeping of the drive frequency.

Figure 3:
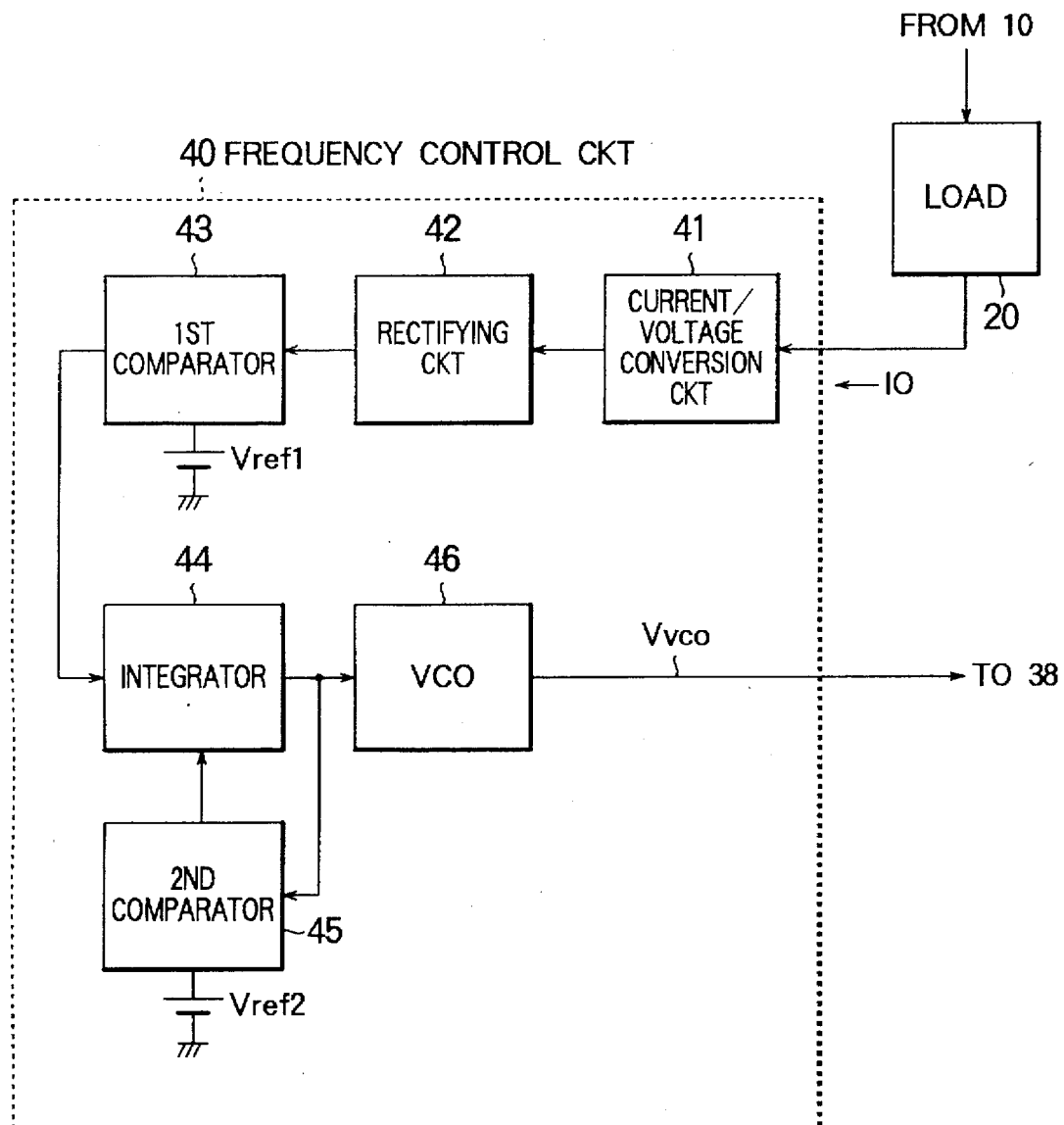
FIG. 3 shows a block diagram of a frequency control circuit for use in the drive circuit illustrated in FIG. 1.

Turning to FIG. 3, the frequency control circuit 40 comprises a current/voltage conversion circuit 41, a rectifying circuit 42, a first comparator 43, an integrator 44, a second comparator 45, and a voltage controlled oscillator (VCO) 46.

The current/voltage conversion circuit 41 is supplied with the feedback current Io from the load 20. The current/voltage conversion circuit 41 converts the feedback current Io into a feedback voltage. The feedback voltage is supplied to the rectifying circuit 42. The rectifying circuit 42 rectifies the feedback voltage to produce a DC voltage. The DC voltage is supplied to the first comparator 43. The first comparator 43 is supplied with a first reference voltage Vref1. The first comparator 43 compares the DC voltage with the first reference voltage Vref1 to produce a first comparison result signal. When the DC voltage is lower than the first reference voltage Vref1, the first comparator 43 produces, as the first comparison result signal, a signal of a logic high level. The first comparison result signal is supplied to the integrator 44.

The integrator 44 has the mainus or the highest voltage as an initial voltage. The integrator 44 carries out integration operation in response to the first comparison result signal to produce an integrated voltage. More specifically, the integrator 44 is composed so as to decrease the integrated voltage at a constant rate while the signal of the logic high level is supplied to the integrator 44. The integrated voltage is supplied to the voltage controlled oscillator 46 as a control voltage. Responsive to the control voltage, the voltage controlled oscillator 46 oscillates the frequency control signal $V_{vco}$ indicative of the drive frequency which is proportional to a voltage level of the integrated voltage. Accordingly, the drive frequency keeps decreasing in a case where the first comparator 43 is supplied with the DC voltage which is less than the first reference voltage Vref1.

Figure 4:
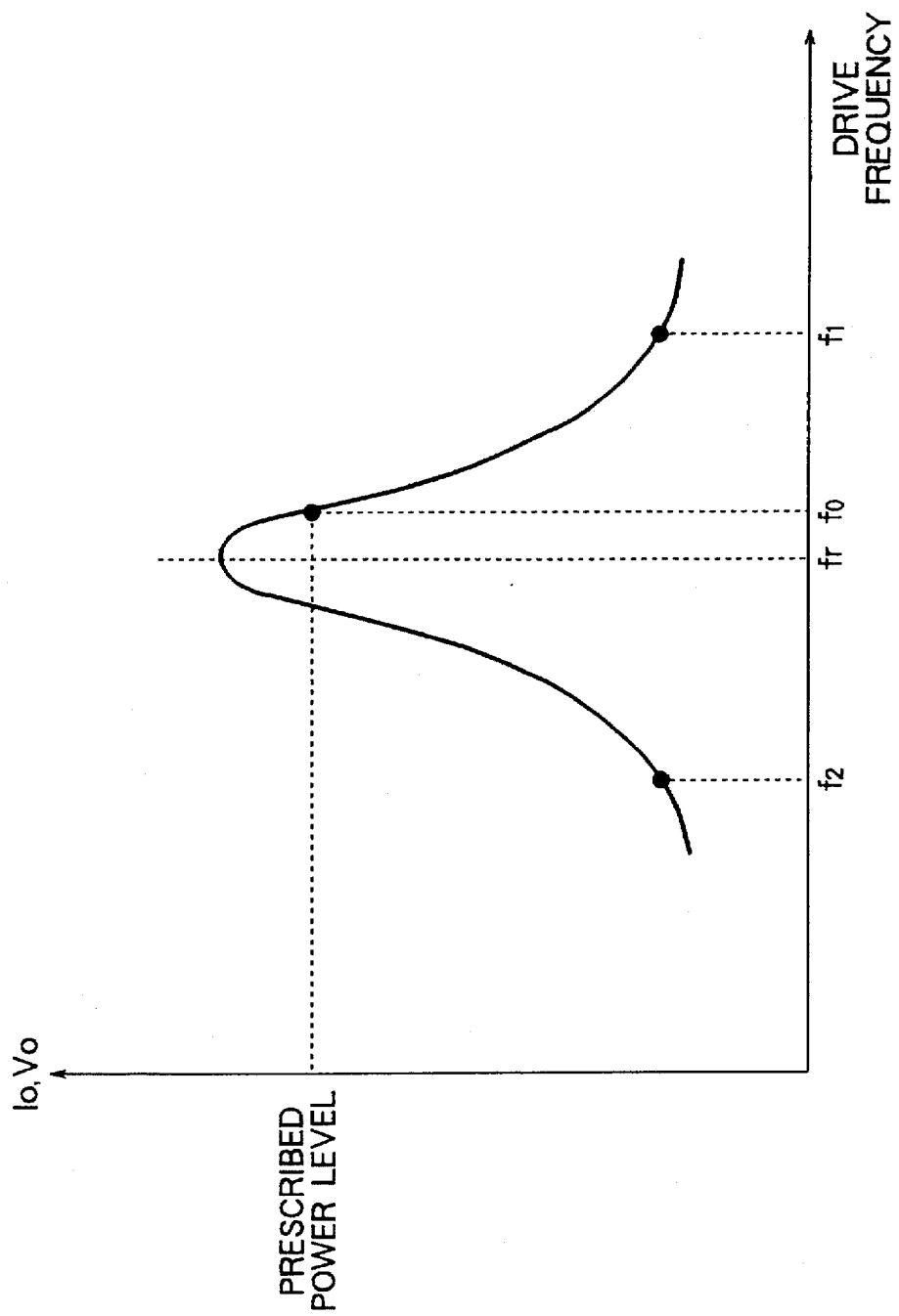
FIG. 4 shows a frequency characteristic of the piezoelectric transformer for use in describing operation of the frequency control circuit illustrated in FIG. 3.

FIG. 4 shows relationship between the drive frequency for the piezoelectric transformer 10 and an effective value or a power level of the output AC voltage Vo of the piezoelectric transformer 10 or the output AC current Io flowing in the load 20. The abscissa and the ordinate represent the drive frequency of the piezoelectric transformer 10 and the power level of the output AC voltage Vo or the output AC current Io. It will be assumed as follows. The piezoelectric transformer 10 has the maximum step-up ratio at the resonance frequency depicted at fr and the piezoelectric transformer 10 produces the output AC voltage Vo having the maximum power level at the resonance frequency fr as shown in FIG. 4. The maximum power level of the output AC voltage Vo is higher than a prescribed power level which corresponds to the first reference voltage Vref1 and to a prescribed frequency f0. The prescribed frequency f0 is higher than the resonance frequency fr as shown in FIG. 4. The integrator 44 initially produces, as the integrated voltage or the control voltage, the maximum voltage. When the control voltage is equal to the maximum voltage, the controlled voltage oscillator 46 oscillates the frequency control signal $V_{vco}$ indicating, as the drive frequency, an upper limit frequency f1 higher than the prescribed frequency f0.

When the piezoelectric transformer 10 is driven by the main drive voltage having the upper limit frequency f1, the piezoelectric transformer 10 produces the output AC voltage Vo having a power level which is less than the prescribed power level as shown in FIG. 4. In this event, the rectifying circuit 42 produces the DC voltage less than the first reference voltage Vref1 and then the first comparator 43 produces, as the first comparison signal, the signal having the logic high level. Accordingly, the integrator 44 produces the integrated voltage or the control voltage so as to decrease gradually. As a result, the drive frequency is shifted downwards from the upper limit frequency f1 so as to approach the prescribed frequency f0.

Inasmuch as the drive frequency becomes low, the step-up ratio of the piezoelectric transformer 10 increases and then power level of the output AC current Io increases with the passage of time. When the drive frequency becomes the prescribed frequency f0, the rectifying circuit 42 produces the DC voltage which is equal to the first reference voltage Vref1. Accordingly, the first comparator 43 produces, the first comparison result signal, the signal having a logic low level. Responsive to the signal having the logic low level, the integrator 44 keeps the integrated voltage at a voltage level immediately before the first comparison result signal shifts from the logic high level to the logic low level. As a result, the voltage controlled oscillator 46 oscillates the frequency control signal $V_{vco}$ indicative of the prescribed frequency f0 and then the piezoelectric transformer 10 is driven by the main drive voltage having the prescribed frequency f0.

It will be now assumed that the load 20 is a cold-cathode tube. In this event, there is a condition where the feedback current Io so that the DC voltage supplied to the first comparator 43 is greater than the first reference voltage Vref1 does not occur in a case where a tube current allowable turning-on or does not flow in the cold-cathode tube although the DC power source is turned on in another case where the DC power source voltage $V_{DD}$ is low. Under the circumstances, the first comparator 43 keeps the first comparison result signal at the logic high level. Accordingly, the drive frequency continues to decrease.

It will be assumed that the drive frequency reaches a lower limit frequency f2 which lower than the resonance frequency fr of the piezoelectric transformer 10. In this event, the integrated voltage is equal to a second reference voltage Vref2. The second comparator 45 compares the integrated voltage with the second reference voltage Vref2 to produce a second comparison result signal. Inasmuch as the integrated voltage is equal to the second reference voltage Vref2, the second comparator 45 produces, as the second comparison signal, a signal having a logic high level that is called a reset signal. The reset signal is supplied to the integrator 44. Responsive to the reset signal, the integrator 44 is reset to produce, as the integrated voltage, the maximum voltage. Accordingly, the voltage controlled oscillator 46 oscillates the frequency control signal $V_{vco}$ indicating, as the drive frequency, the upper limit frequency f1. The drive frequency is shifted from the upper limit frequency f1 downwards. Thereafter, the above-mentioned operation is repeated.

If the output AC voltage Vo of the piezoelectric transformer 10 is too high, the piezoelectric transformer 10 destroys itself. To prevent such destruction, another drive circuit is disclosed in the above-mentioned JP-A 8-107,678.

Figure 5:
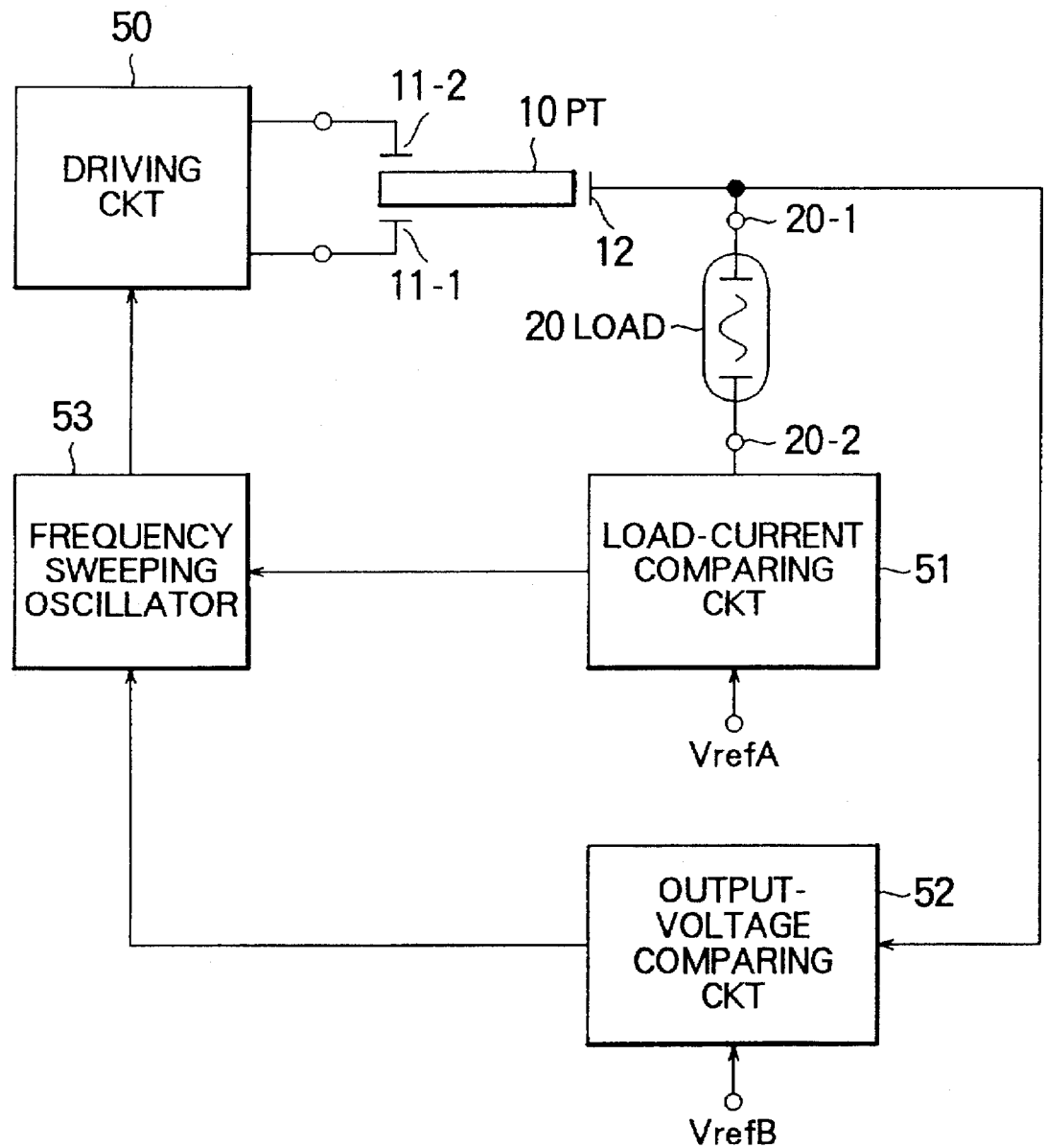
FIG. 5 shows a block diagram of another conventional drive circuit for a piezoelectric transformer.

FIG. 5 shows another conventional drive circuit disclosed in JP-A 8-107,678. The illustrated drive circuit comprises a driving circuit 50, a load-current comparing circuit 51, an output-voltage comparing circuit 52, and a frequency sweeping oscillator 53. The driving circuit 50 is connected to the first and the second primary electrodes 11-1 and 11-2 of the piezoelectric transformer 10. The load 20 has a load high-voltage terminal 20-1 and a load low-voltage terminal 20-2. The piezoelectric transformer 10 has the secondary electrode 12 which is connected to the load high-voltage terminal 20-1 of the load 20. The load-current comparing circuit 51 is connected to the load low-voltage terminal 20-2 of the load 20 and is supplied with a load-current reference voltage VrefA. The output-voltage comparing circuit 52 is connected to the secondary electrode 12 of the piezoelectric transformer 10 and is supplied with an output-voltage reference voltage VrefB. The frequency sweeping oscillator 53 is connected to the load-current comparing circuit 51, the output-voltage comparing circuit 52, and the driving circuit 50.

The load-current comparing circuit 51 is supplied with load current from the load 20. The load-current comparing circuit 51 converts the load current into a DC voltage. Subsequently, the load-current comparing circuit 51 compares the DC voltage with the load-current reference voltage VrefA which corresponds to a desired load-current value. The load-current comparing circuit 51 produces a load-current comparison result signal. The load-current comparison result signal is supplied to the frequency sweeping oscillator 53. On the basis of the load-current comparison result signal, the frequency sweeping oscillator 53 determines a direction in a frequency sweeping of the drive frequency. More specifically, when the load-current comparison result signal indicates that the DC voltage is higher than the load-current reference voltage VrefA, the frequency sweeping oscillator 53 carries out the frequency sweeping of the drive frequency downward. When the load-current comparison result signal indicates that the DC voltage is lower than the load-current reference voltage VrefA, the frequency sweeping oscillator 53 carries out the frequency sweeping of the drive frequency upward.

With this structure, inasmuch as the load current always remains close to a desired load-current value, the drive frequency also remains close to a frequency corresponding to the desired load-current value.

The frequency sweeping oscillator 53 has upper and lower limit frequencies for the frequency sweeping. When the load current does not reach the desired load-current value, the drive frequency arrives at the lower limit frequency. When the drive frequency arrives at the lower limit frequency, the frequency sweeping oscillator 53 sweeps the drive frequency with a high-speed frequency sweeping to shift from the lower limit frequency to the upper limit frequency and then starts the frequency sweeping downward again.

The output-voltage comparing circuit 52 is supplied with the output AC voltage from the piezoelectric transformer 10. The output-voltage comparing circuit 52 divides and rectifies the output AC voltage to produce a divided-rectified voltage. Subsequently, the output-voltage comparing circuit 52 compares the divided-rectified voltage with the output-voltage reference voltage VrefB which corresponds to a desired output AC voltage. The output-voltage comparing circuit 52 produces an output-voltage comparison result signal. The output-voltage comparison result signal is supplied to the frequency sweeping oscillator 53. On the basis of the output-voltage comparison result signal, the frequency sweeping oscillator 53 determines the direction in the frequency sweeping of the drive frequency. More specifically, when the output-voltage comparison result signal indicates that the divided-rectified voltage is higher than the output-voltage reference voltage VrefB, the frequency sweeping oscillator 53 switches the frequency sweeping of the drive frequency from downward to upward. With this structure, the drive frequency of the piezoelectric transformer 10 shifts so as to make the step-up ratio of the piezoelectric transformer 10 put into a low state when the load 20 is put into an open state for any reasons and it results in decreasing the output AC voltage. As a result, it is possible to prevent the piezoelectric transformer 10 from destroying due to over-vibration of the piezoelectric transformer 10 caused by the rapid increase of the output AV voltage of the piezoelectric transformer 10.

Figure 6:
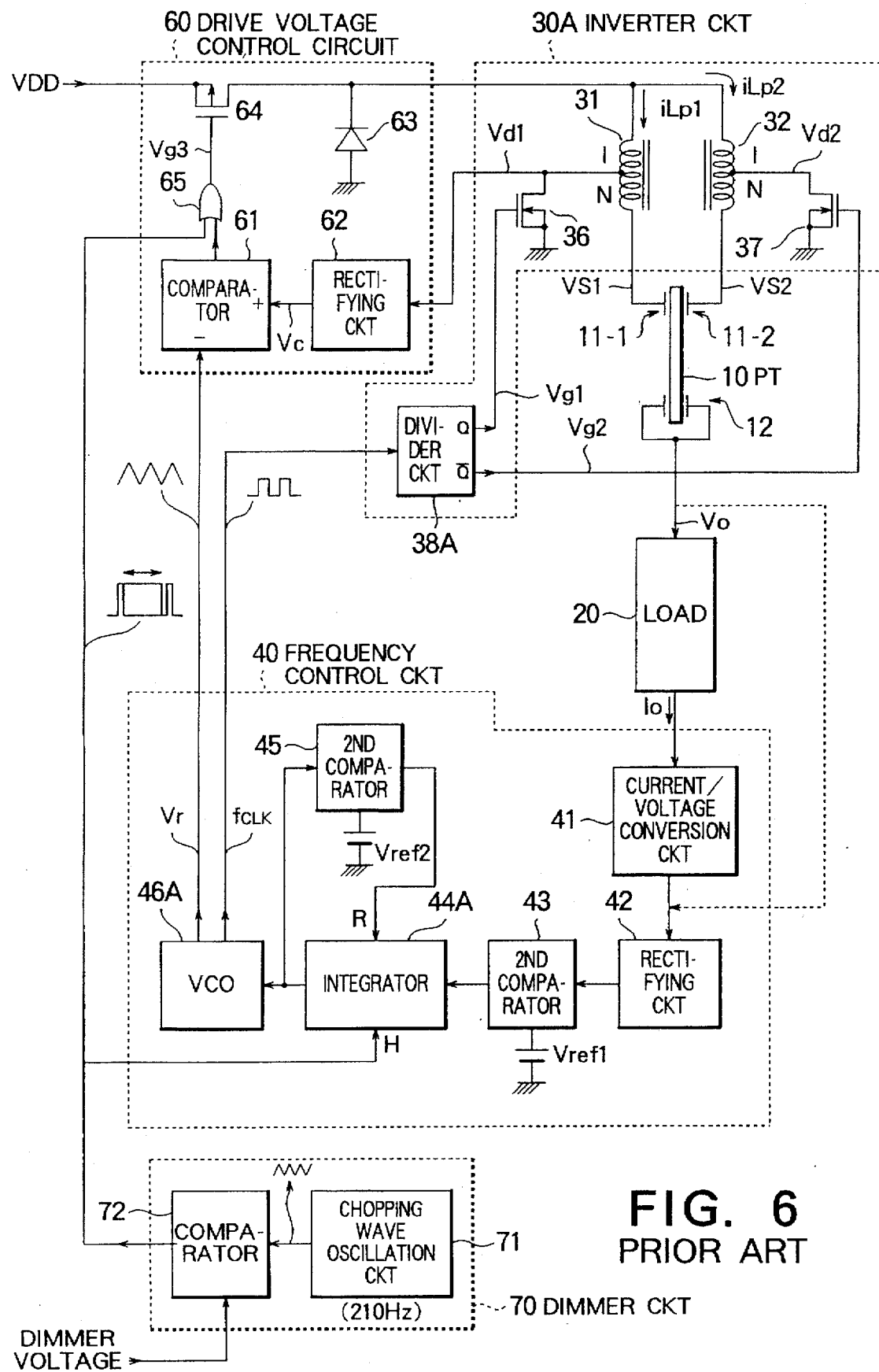
FIG. 6 shows a block diagram of still another conventional drive circuit for a piezoelectric transformer.

FIG. 6 shows still another conventional drive circuit disclosed in the above-mentioned JP-A 9-107,684. The illustrated drive circuit is operable at a high efficiency in a wide input DC voltage range. The illustrated drive circuit has a function so as to keep the input AC voltage at a constant power level although the DC power source voltage changes. The drive frequency is used in the vicinity of the resonance frequency of the piezoelectric transformer although the DC power source voltage changes.

The illustrated drive circuit comprises an inverter circuit 30A, a frequency control circuit 40A, a drive voltage control circuit 60, a dimmer circuit 70. The inverter circuit 30A is similar in structure to the inverter circuit 30 illustrated in FIG. 1 except that a divider circuit 38A is used in lieu of the two-phase drive circuit 38. In addition, the frequency control circuit 40A is similar in structure to the frequency control circuit 40 illustrated in FIG. 3 except that the integrator and the voltage controlled oscillator are modified to different from those described in conjunction with FIG. 3 as will later become clear. The integrator and the voltage controlled oscillator are therefore depicted at 44A and 46A, respectively.

The integrator 44A is put into a holding state in response to an output signal from the dimmer circuit 70. The voltage controlled oscillator 46A oscillates, as the frequency control signal, a clock signal $f_{CLK}$ having a clock frequency twice the drive frequency of the piezoelectric transformer 10. Furthermore, the voltage controlled oscillator 46A oscillates a chopping wave signal Vr having a fundamental frequency twice the drive frequency of the piezoelectric transformer 10. The divider circuit 38A frequency divides the clock signal $f_{CLK}$ on the basis of a division ratio of two to produce the first and the second clock signals Vg1 and Vg2 for alternately driving the first and the second switching transistors 36 and 37.

The drive voltage control circuit 60 comprises a comparator 61, a rectifying circuit 62, a diode 63, and a power transistor 64. The power transistor 64 is a P-channel power MOSFET having gate, drain, and source electrodes. The source electrode of the P-channel power MOSFET 64 is supplied with the DC power source voltage $V_{DD}$ from the DC power source (not shown). The drain electrode of the P-channel power MOSFET 64 is connected to a cathode of the diode 63. The diode 64 has an anode which is grounded.

The drive voltage control circuit 60 controls the main drive voltage of the piezoelectric transformer 10 at a predetermined value by controlling so that peak current value of currents, which are supplied to the subsidiary transformers or the first and the second auto-transformers 31 and 32, is not varied depending on the DC power source voltage $V_{DD}$.

The comparator 61 is supplied with the chopping wave signal Vr from the voltage controlled oscillator 46A in the frequency control circuit 40A. The rectifying circuit 62 is supplied with the first drain voltage Vd1. The rectifying circuit 62 rectifies the first drain voltage Vd1 to produce a rectified voltage $V_C$. The rectified voltage $V_C$ is supplied to the comparator 61. The comparator 61 compares the chopping wave signal Vr with the rectified voltage $V_C$ to produce a comparison result signal. The comparison result signal is supplied via an OR gate 65 to a gate electrode of the transistor 64 as a gate voltage Vg3. The DC power source voltage $V_{DD}$ is supplied to the inverter circuit 30A via the transistor 64 and the diode 63 as an input DC voltage.

The dimmer circuit 70 comprises a chopping wave oscillation circuit 71 and a comparator 72. The chopping wave oscillation circuit 71 oscillates a chopping wave signal having a fundamental frequency of 210 Hz. The chopping wave signal is supplied to the comparator 72 which is supplied with a dimmer voltage. The comparator 72 compares the chopping wave signal with the dimmer voltage to produce a dimmer control signal. The dimmer control signal is supplied to the gate electrode of the power transistor 64 via the OR gate 65 as the gate voltage Vg3. The dimmer control signal is also supplied to a holding terminal of the integrator 44A.

Referring to FIGS. 7A through 7F and FIGS. 8A through 8F, description will made about operation of the still another conventional drive circuit illustrated in FIG. 6. FIGS. 7A through 7F show time charts in a case where the rectified voltage $V_C$ is relatively low while FIGS. 8A through 8F show time charts in another case where the rectified voltage $V_C$ is relatively high.

Figure 8A:
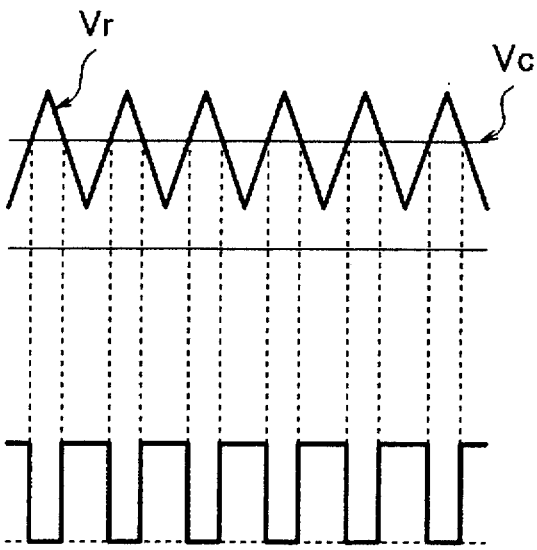
FIGS. 8A through 8F are time charts for use in describing operation of the drive circuit illustrated in FIG. 6 in a case where a rectified voltage is relatively high.
Figure 8B:
Figure 8C:
Figure 8D:
Figure 8E:
Figure 8F:
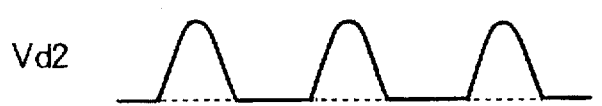

Each of FIGS. 7A and 8A shows waveforms of the rectified voltage $V_C$ and the chopping wave signal Vr which are produced by the rectifying circuit 62 and the voltage controlled oscillator 46A, respectively. Each of FIGS. 7B and 8B shows a waveform of the gate voltage Vg3 supplied to the gate electrode of the power transistor 64. Each of FIGS. 7C and 8C shows a waveform of the first clock signal Vg1 supplied to the gate electrode of the first switching transistor 36 while each of FIGS. 7D and 8D shows a waveform of the second clock signal Vg2 supplied to the gate electrode of the second switching transistor 37. Each of FIGS. 7E and 8E shows a waveform of the first drain voltage Vd1 in the first switching transistor 36 while each of FIGS. 7F and 8F shows a waveform of the second drain voltage Vd2 in the second switching transistor 37.

It will be assumed that each of the first and the second drain voltages Vd1 and Vd2 has a relatively small amplitude. In this event, the rectified voltage $V_C$ has a small level as shown in FIG. 7A. Inasmuch as the rectified voltage $V_C$ has the small level, the gate voltage Vg3 has a small duty factor as shown in FIG. 7B. As a result, the power transistor 64 is put into OFF state for a relatively short time interval and then a relatively large input power is supplied to the inverter circuit 30A. Accordingly, each of the first and the second drain voltages Vd1 and Vd2 becomes a large amplitude as shown in FIGS. 7E and 7F.

It will be presumed that each of the first and the second drain voltages Vd1 and Vd2 has a relatively large amplitude. In this event, the rectified voltage $V_C$ has a large level as shown in FIG. 8A. Inasmuch as the rectified voltage $V_C$ has the large level, the gate voltage Vg3 has a large duty factor as shown in FIG. 8B. As a result, the power transistor 64 is put into OFF state for a relatively long time interval and then a relatively small input power is supplied to the inverter circuit 30A. Accordingly, each of the first and the second drain voltages Vd1 and Vd2 become a small amplitude as shown in FIGS. 8E and 8F.

With above-mentioned control, each of the first and the second drain voltages Vd1 and Vd2 is controlled so as to have a constant amplitude.

However, the above-mentioned conventional drive circuits have problems as follows. Description will first be directed to a first problem. The higher the drive frequency becomes, the higher a peak value of currents flowing through the first and the second subsidiary transformers 31 and 32 becomes on inversion of the first and the second clock signals Vg1 and Vg2. The frequency control circuit continues the frequency sweeping of the drive frequency forever or for a long time interval in a case where the cold cathode tube acting as the load 20 does not light up due to high impedance of the cold cathode tube because of low ambient air temperature or the like and in another case where the load is put into an open state due to cutoff or the like. Under the circumstances, the peak value of the currents flowing the subsidiary transformers increases on the inversions of the first and the second clock signals Vg1 and Vg2. As a result, the first and the second auto-transformers 31 and 32 and the first and the second switching transistors 36 and 37 will develop heat.

More specifically, in the above-mentioned cases, the feedback current Io such that the DC voltage supplied to the first comparator 43 is larger than the first reference voltage Vref does not flow through the load 20. In this event, the first comparator 43 produces the first comparison result result signal of the logic high level. As a result, the drive frequency decreases. Inasmuch as the impedance of the load 20 is high, the piezoelectric transformer 10 generates the output AC voltage Vo having a large amplitude. When the drive frequency reaches the lower limit frequency, the second comparator 45 produces the reset signal as the second comparison result signal. As a result, the integrator 44 is reset to produce the maximum voltage as the integrated voltage. The drive frequency is shifted from the upper limit frequency f1 downwards. Thereafter, the above-mentioned operation is repeated forever or for the long time interval.

FIG. 9A shows a waveform of the first drain voltage Vd1 together with the first clock signal Vg1 in a case where the drive frequency is equal to the prescribed frequency f0 which is nearly equal to the resonance frequency fr of the piezoelectric transformer 10. FIG. 9B shows a waveform of the first drain voltage Vd1 together with the first clock signal Vg1 in another case where the drive frequency is equal to the upper limit frequency f1. The second drain voltage Vg2 has a waveform which is similar to that of the first drain voltage Vg1.

As shown in FIG. 9A, in the case where the drive frequency is equal to the received frequency f0 or is nearly equal to the resonance frequency fr, each of the first and the second drain voltages Vd1 and Vd2 has a half-wave rectified waveform with a zero volt for a half of the resonance period of the piezoelectric transformer 10 due to voltage resonance defined by the equivalent input capacitance of the piezoelectric transformer 10 and the load 20 and a total inductance of the primary and the secondary inductances of the subsidiary transformers 31 and 32.

It will be assumed that the drive frequency is equal to the upper limit frequency f1. In this event, each of the first and the second drain voltages Vd1 and Vd2 has a high level immediately before zero switching as shown in FIG. 9B. In general, the higher the drive frequency becomes than the prescribed frequency f0, the higher the voltage immediately before zero switching becomes. This is because a time interval of one period becomes shorter. As a result, the higher the drive frequency becomes, the larger the peak value of the currents flowing in the first and the second auto-transformers 31 and 32 and in the first and the second switching transistors 36 and 37 becomes on inversion of the first and the second clock signals Vg1 and Vg2. Inasmuch as the frequency sweeping of the drive frequency is repeated forever or for the long time interval, the drive frequency repeatedly passes through the upper limit frequency f1 which is extremely higher than the prescribed frequency f0. As a result, electronic parts composing the inverter circuit develop heat.

Description will be directed to a second problem. Although the feedback current Io is set in the same value, the drive frequency enable to flow the feedback current Io in stable varies depending on impedance due to type of the load, used environment, and with time. In addition, inasmuch as a setting value of the feedback current Io varies with respect to setting of brightness of the cold cathode tube serving as the load 20, the drive frequency also varies although impedance of the load 20 is fixed. Accordingly, the drive frequency must be laid in a frequency sweeping range of the drive frequency oscillated by the voltage controlled oscillator under all conditions. As a result, it is in design difficult to make the upper limit frequency f1 of the voltage controlled oscillator shift downward when the integrator is reset to produce the maximum voltage as the integrated voltage.

More specifically, the frequency control circuit shifts the drive frequency downward from the upper limit frequency f1 of the voltage controlled oscillator when the integrator is reset to produce the maximum voltage as the integrated voltage. An output frequency of the voltage controlled oscillator becomes constant when the DC voltage supplied to the first comparator 43 is larger than the first reference voltage Vref1 and then the piezoelectric transformer 10 is driven by a constant frequency. Accordingly, the upper limit frequency f1 must be set in a frequency higher than any drive frequency which varies depending on the impedance of the load or setting of brightness. Otherwise the cold cathode tube cannot light up in stable.

To resolve the first problem must shift the upper limit frequency f1 to a lower frequency. On the contrary, to resolve the second problem must shift the upper limit frequency f1 to a higher frequency. Accordingly, the first and the second problems conflict with each other and it is therefore difficult to design the drive circuit for the piezoelectric transformer 10, as mentioned in the preamble of the instant specification.

Figure 10:
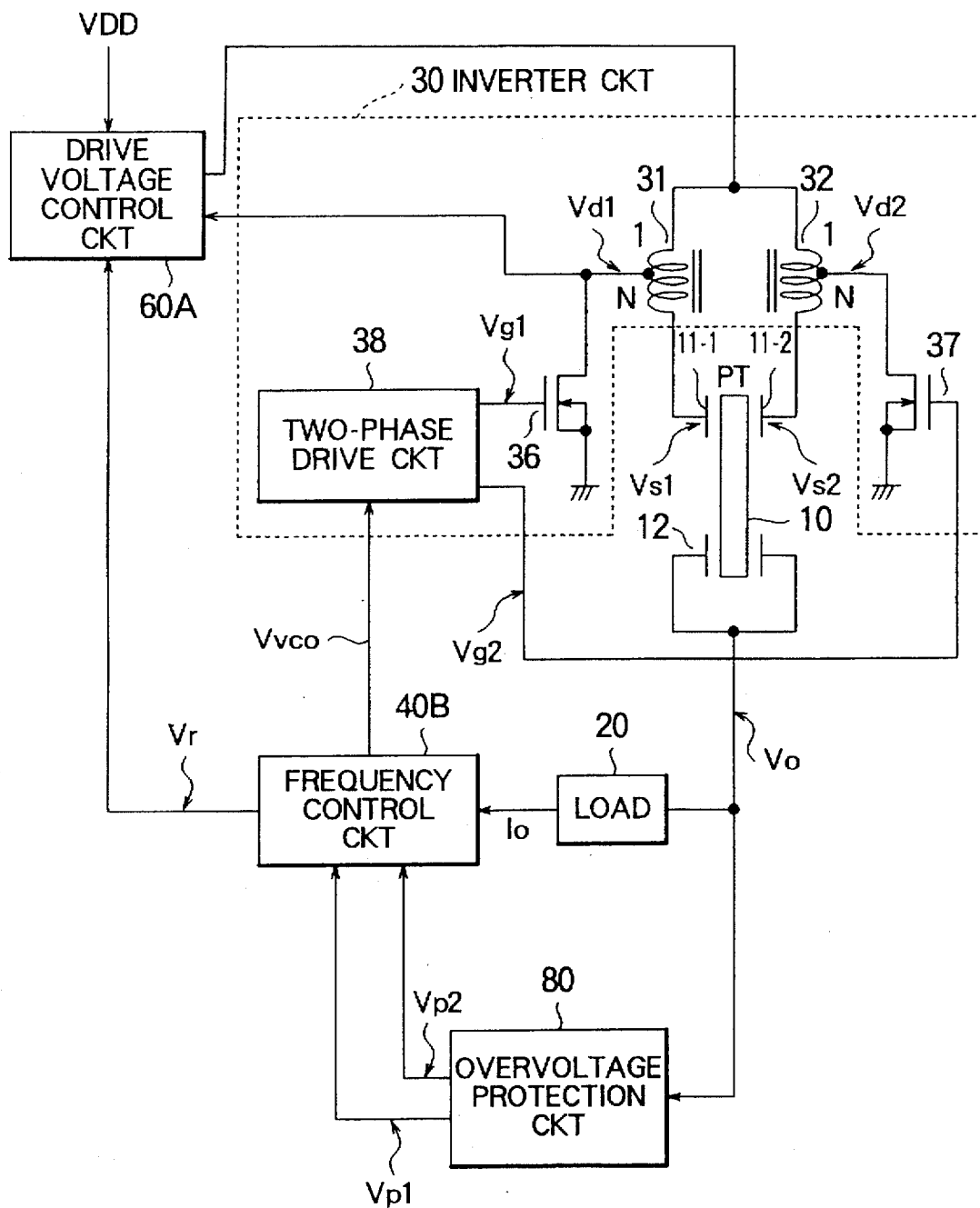
FIG. 10 shows a block diagram of a drive circuit for a piezoelectric transformer according to a first embodiment of this invention.

Referring to FIG. 10, the description will proceed to a drive circuit for the piezoelectric transformer (PT) 10 according to a first embodiment of this invention. The illustrated drive circuit is similar in structure to that illustrated in FIG. 1 except that the frequency control circuit is modified to be different from that described in conjunction with FIG. 1 as will later become clear and the drive circuit further comprises the drive voltage control circuit and an overvoltage protection circuit 80. The frequency control circuit is therefore depicted at 40B.

The piezoelectric transformer 10 is made of a plate-shaped piezoelectric ceramics on which the first and the second primary electrodes 11-1 and 11-2 and the secondary electrode 12 are formed. The first and the second primary electrodes 11-1 and 11-2 are polarized in a thick direction while the secondary electrode 12 is polarized in a longitudinal direction. Such a piezoelectric transformer is called a third-order Rozen type piezoelectric transformer.

The first and the second primary electrodes 11-1 and 11-2 are supplied with an input AC voltage having the resonance frequency in the manner which is described above. The piezoelectric transformer 10 converts the input AC voltage in an output AC voltage by mechanical vibration using piezoelectric effect. The output AC voltage Vo is produced by the secondary electrode 12. The piezoelectric transformer 10 has a high output impedance and its operation depends on impedance of the load 20. Accordingly, the piezoelectric transformer 10 generates the output AC voltage having a high amplitude if the load 20 has a high impedance. The output AC voltage Vo is supplied to the load 20. Responsive to the output AC voltage Vo, an output AC current Io flows in the load 20. At any rate, the piezoelectric transformer 10 serves as a main transformer.

The inverter circuit 30 is supplied with a DC power source voltage $V_{DD}$ from a DC power source (not shown) via the drive voltage control circuit 60A as an input DC voltage. The DC power source may be a battery pack. When the battery pack is used as the DC power source, the DC power source voltage $V_{DD}$ varies with time. The inverter circuit 30 is connected to the first and the second primary electrodes 11-1 and 11-2 of the piezoelectric transformer 10. The inverter circuit 30 is supplied with the frequency control signal $V_{vco}$ from the frequency control circuit 40B in the manner which will become clear. Responsive to the frequency control signal $V_{vco}$, the inverter circuit 30 converts the input DC voltage into a main drive voltage. The main drive voltage is suppled to the first and the second primary electrodes 11-1 and 11-2 of the piezoelectric transformer 10 as the input AC voltage.

The inverter circuit 30 comprises the first and the second auto-transformers 31 and 32, the first and the second switching transistors 36 and 37, and the two-phase drive circuit 38. The first and the second auto-transformers 31 and 32 act as the first and the second subsidiary transformers each of which belongs to the group of an electromagnetic transformer. The first and the second auto-transformers 31 and 32 have first and second primary windings and first and second secondary windings, respectively, which have turns ratio of N. In the auto-transformer, the primary winding is connected to the secondary winding. On the contrary, the primary winding is separated from the secondary winding in a general or a normal electromagnetic transformer.

The first and the second auto-transformers 31 and 32 have first and second primary terminals, first and second secondary terminals, and first and second intermediate terminals, respectively. The first and the second primary terminals of the first and the second auto-transformers 31 and 32 are connected via the drive voltage control circuit 60A to the DC power source in common. The first and second secondary terminals of the first and the second auto-transformers 31 and 32 are connected to the first and the second primary electrodes 11-1 and 11-2 of the piezoelectric transformer 10, respectively.

In the example being illustrated, each of the first and the second switching transistors 36 and 37 is composed of an N-channel field effect transistor (FET) which has drain, source, and gate electrodes. The drain electrode of the first switching transistor 36 is connected to the first intermediate terminal of the first auto-transformer 31 while the drain electrode of the second switching transistor 37 is connected to the second intermediate terminal of the second auto-transformer 32. That is, each drain electrode of the first and the second switching transistors 36 and 37 serves as an output terminal. The source electrodes of the first and the second auto-transistors 36 and 37 are grounded. The gate electrodes of the first and the second auto-transistors 36 and 37 are connected to the two-phase drive circuit 38.

The two-phase drive circuit 38 is supplied with the frequency control signal $V_{vco}$ from the frequency control circuit 40B. Responsive to the frequency control signal $V_{vco}$, the two-phase drive circuit 38 alternately drives the first and the second switching transistors 36 and 37 using the first and the second clock signals Vg1 and Vg2 in the manner which is described above.

The frequency control circuit 40B detects the output AC current Io which flows in the load 20. Responsive to the output AC current Io, the frequency control circuit 40B generates the frequency control signal $V_{vco}$ and the chopping wave signal Vr in the similar manner which is described in conjunction with the frequency control circuit 40A illustrated in FIG. 6.

The drive voltage control circuit 60A is supplied with the chopping wave signal Vr from the frequency control circuit 40B. In addition, the drive voltage control circuit 60A is supplied with the DC power source voltage $V_{DD}$ from the DC power source. Furthermore, the drive voltage control circuit 60A is supplied with the first drain voltage Vg1 in the first switching transistor 36. On the basis of the chopping wave signal Vr and the first drain voltage Vg1, the drive voltage control circuit 60A controls supply of the DC power source voltage $V_{DD}$ to the inverter circuit 30 so as to keep a peak value of the first drain voltage Vg1 at a constant level.

It will now be assumed that the load 20 is a cold-cathode tube. The cold-cathode tube has generally an impedance of about 100 kΩ. Such a cold-cathode tube is herein referred to a normal-state cold-cathode tube. However, the cold-cathode tube has a higher impedance than that of the normal-state cold-cathode tube in a case where the cold-cathode tube does not light up because of low ambient air temperature of the like and in another case where the cold-cathode tube is put into an open state due to cutoff or the like. Such a cold-cathode tube is herein referred to an abnormal-state cold-cathode tube. When the abnormal-state cold-cathode tube is connected to the secondary electrode 12 of the piezoelectric transformer 10, the piezoelectric transformer 10 produces the output AC voltage Vo having a higher amplitude in comparison with the piezoelectric transformer 10 connected to the normal-state cold-cathode tube.

The output AC voltage Vo is supplied to the overvoltage protection circuit 80. In order to protect the piezoelectric transformer 10 from destroying, on detection of overvoltage in the output AC voltage Vo, the overvoltage protection circuit 80 supplies the frequency control circuit 40B with an additional reset signal Vp1 and a switching signal Vp2 in the manner which will later become clear.

Description will proceed to operation of the drive circuit illustrated in FIG. 10. The first and the second switching transistors 36 and 37 are alternately put into an ON state in response to the first and the second clock signals Vg1 and Vg2 produced by the divider circuit 38A. The first and the second clock signals Vg1 and Vg2 have reversed phase each other. When the first switching transistor 36 is put into the ON state, the DC power source allows current via the drive voltage control circuit 60A to flow through the first primary winding of the first auto-transformer 31 to charge the current as energy of magnetic field. When the first switching transistor 36 is put into an OFF state, the first auto-transformer 36 discharges the energy of magnetic field to generate a high AC voltage having an amplitude higher than that of the DC power source voltage $V_{DD}$. Likewise, when the second switching transistor 37 is put into the ON state, the DC power source allows current via the drive voltage control circuit 60A to flow through the primary winding of the second auto-transformer 32 to charge the current as energy of magnetic field. When the second switching transistor 37 is put into an OFF state, the second auto-transformer 37 discharges the energy of magnetic field to generate a high AC voltage having an amplitude higher than that of the DC power source voltage $V_{DD}$. As shown in FIGS. 2A and 2B, each of the first and the second drain voltages Vd1 and Vd2 has a half wave rectified waveform of a peak voltage equal to about three times as large as the amplitude of the DC power source voltage $V_{DD}$. The second drain voltage Vd2 is shifted 180° away from the first drain voltage Vd1. In addition, each of first and the second drain voltages Vd1 and Vd2 has zero volt during a time duration which is a half times as large as a resonance period of the piezoelectric transformer 10.

As shown in FIGS. 2C and 2D, each of the first and the second input voltages Vs1 and Vs2 has a voltage peak which is equal to about 3X(N+1) times as large as the amplitude of of the DC power source voltage $V_{DD}$. The second input voltage Vs2 is shifted 180° away from the first input voltage Vs1. Each of the first and the second input voltages Vs1 and Vs2 has a voltage resonance waveform which is defined by the equivalent input capacitance $C_L$ of the combination of the piezoelectric transformer 10 and the load 20, the primary inductance Lp of the first and the second primary windings of the first and the second auto-transformers 31 and 32, and the secondary inductance Ls of the first and the second secondary windings of the first and the second auto-transformers 31 and 32. Inasmuch as each of the first and the second input voltages Vs1 and Vs2 has the voltage peak which is higher than the DC power source voltage $V_{DD}$, the inverter circuit 30A may be called a step-up circuit.

Inasmuch as the first and the second input voltages Vs1 and Vs2 are alternately supplied to the first and the second primary electrodes 11-1 and 11-2 of the piezoelectric transformer 10, the main drive voltage having an equivalently sinusoidal waveform makes the piezoelectric transformer 10 oscillate. Accordingly, the second secondary electrode 12 of the piezoelectric transformer 10 generates the output AC voltage Vo which is M times as large as the main drive voltage, where M represents a step-up ratio of the piezoelectric transformer 10 that is defined by the geometry of the piezoelectric transformer 10. The output AC voltage Vo is applied to the load 20 and then the output AC current or a load current Io flows in the load 20. The load current Io is supplied or fed back to the frequency control circuit 40B as a feedback current.

Figure 11:
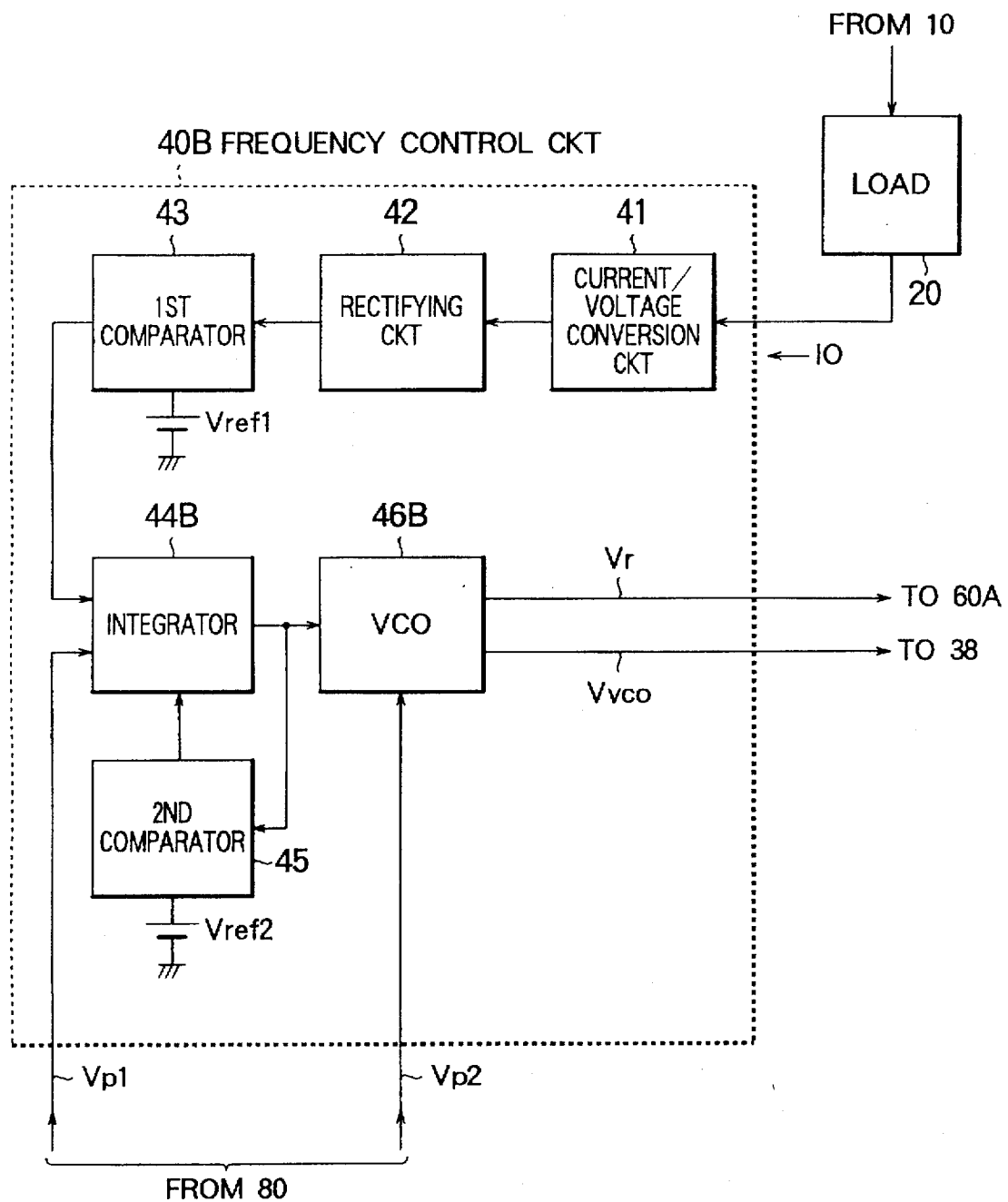
FIG. 11 shows a block diagram of a frequency control circuit for use in the drive circuit illustrated in FIG. 10.

Turning to FIG. 11, the frequency control circuit 40B is similar in structure to the frequency control circuit 40 illustrated in FIG. 3 except that the integrator and the voltage controlled oscillator are modified to be different from those described in conjunction with FIG. 3 as will later become clear. The integrator and the voltage controlled oscillator are therefore depicted at 44B and 46B, respectively.

The current/voltage conversion circuit 41 converts the feedback signal Io into the feedback voltage which is divided by a ratio of its resistance value. The rectifying circuit 42 converts the feedback voltage into the DC voltage. The first comparator 43 compares the DC voltage with the first reference voltage Vref1 to produce the first comparison result signal. The integrator 44B includes a discharge path (not shown). When the DC voltage is lower than the first reference voltage Vref1, the first comparator 43 produces, as the first comparison result signal, a discharge path cutoff signal. While the discharge path cutoff signal is supplied to the integrator 44B, the integrator 44B cuts the discharge path off to increase an integrated voltage at a constant rate. The integrated voltage is supplied to the voltage controlled oscillator 46B as a control voltage. Responsive to the control voltage, the voltage controlled oscillator 46B oscillates at a frequency indicative of a drive frequency which is inversely proportional to a voltage level of the control voltage. The piezoelectric transformer 10 is driven at the drive frequency. As apparent from the above-mentioned description, the drive frequency shifts downward while the first comparator 43 is supplied with the DC voltage which is lower than the first reference voltage Vref1.

The integrator 44B is supplied with the additional reset signal Vp1 from the overvoltage protection circuit 80 in the manner which will later become clear. Responsive to the additional reset signal Vp1, the integrator 44B is reset to produce the lowest voltage as the integrated voltage.

Figure 12:
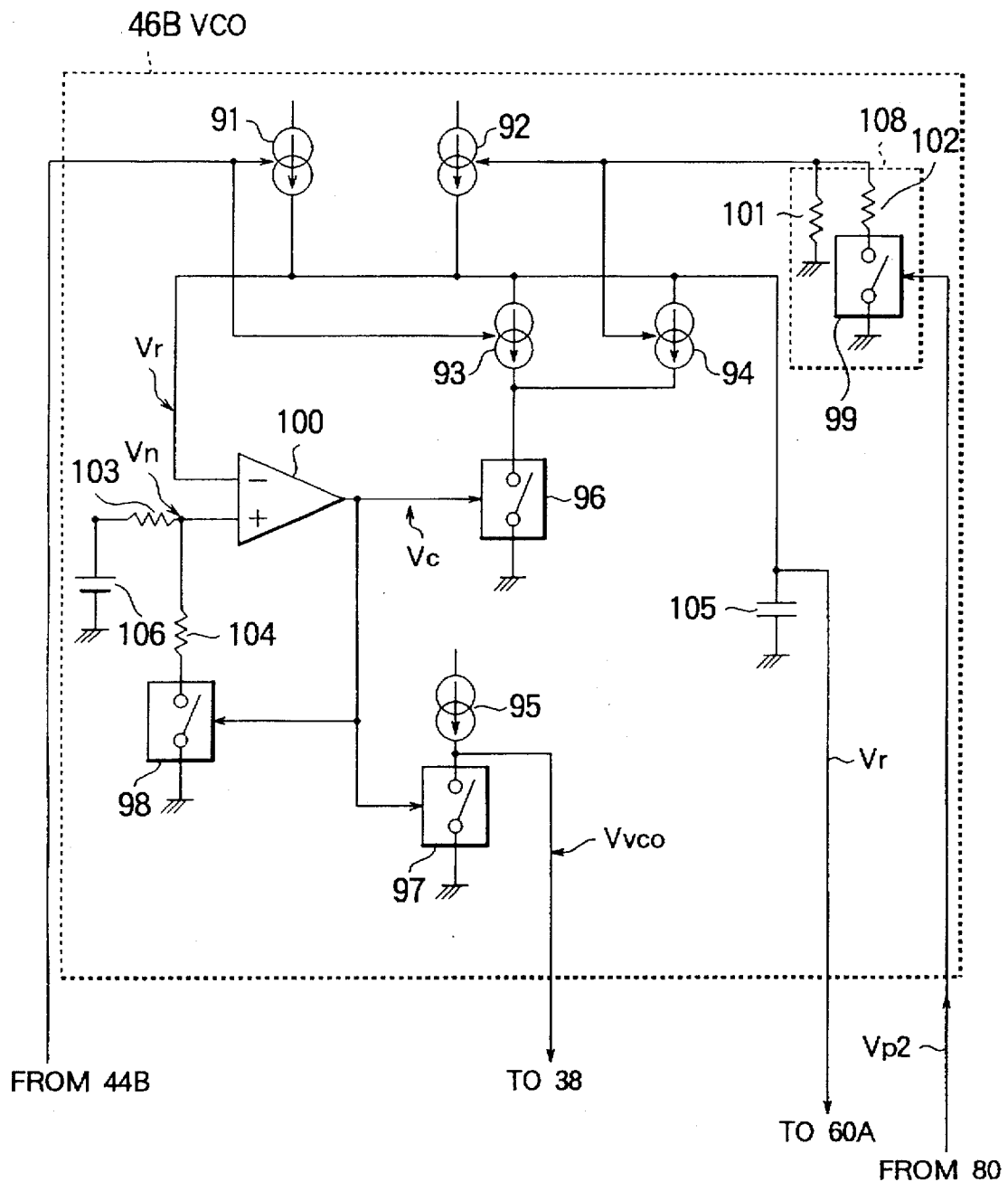
FIG. 12 shows a block diagram of a voltage controlled oscillator for use in the frequency control circuit illustrated in FIG. 11.

Turning to FIG. 12, the voltage controlled oscillator 46B comprises first through fifth constant current sources 91, 92, 93, 94, and 95, first through fourth switches 96, 97, 98, and 99, a comparator 100, first through fourth resistors 101, 102, 103, and 104, a capacitor 105, and an electric cell 106. The comparator 100 has an inversion input terminal which is connected to outflow terminals of the first and the second constant current sources 91 and 92 and to inflow terminals of the third and the fourth constant current sources 93 and 94. In addition, the comparator 100 has an noninversion terminal which is connected to the electric cell 106 via the third resistor 103 and which is grounded via a series circuit composed of the fourth resistor 104 and the third switch 98. Furthermore, the comparator 100 has an output terminal which is connected to control terminals of the first through the third switches 96 to 98.

The first and the third constant current sources 91 and 93 have control terminals which are supplied with control voltage from the integrator 44B (FIG. 11). The second and the fourth constant current sources 92 and 94 have control terminals which is connected to a variable resistor 108 composed of the first and the second resistors 101 and 102 and the fourth switch 99. More specifically, in the variable resistor 108, the first resistor 101 has an end connected to the control terminals of the second and the fourth constant current sources 92 and 94 and another end which is grounded. The second resistor 102 has an end connected to the control terminals of the second and the fourth constant current sources 92 and 94 and another end which is grounded via the fourth switch 99. The fourth switch 99 has a control terminal which is supplied with the switching signal Vp2 from the overvoltage protection circuit 80 (FIG. 10). The capacitor 105 has an end which is connected to the inversion terminal of the comparator 100 and to the drive voltage control circuit 60A (FIG. 10). The capacitor 105 has another end which is grounded. The third and the fourth constant current sources 93 and 94 have outflow terminals which are grounded via the first switch 96. The fifth constant current source 95 has an outflow terminal which is grounded via the second switch 97 and which is connected to the two-phase drive circuit 38 (FIG. 10).

With this structure, the voltage controlled oscillator 46B has an output frequency which is determined by a charge/discharge frequency for the capacitor 105. The charge/discharge frequency for the capacitor 105 is determined by a charge/discharge current value of current which flows in and out the capacitor 105. The charge/discharge current value is equal to a total current value of first through fourth constant currents obtained from the first through the fourth constant current sources 91 to 94, respectively. The first constant current obtained from the first constant current source 91 is determined by the integrated voltage produced by the integrator 44B (FIG. 11). The higher the integrated voltage becomes, the smaller the first constant current becomes. The third constant current obtained from the third constant current source 93 is set so as to become twice the first constant current obtained from the first constant current source 91. The second constant current obtained from the second constant current source 92 is determined by a resistance value of the variable resistor 108. The larger the resistance value of the variable resistor 108 becomes, the smaller the second constant current becomes. The fourth constant current obtained from the fourth constant current source 94 is set so as to become twice the second constant current obtained from the second constant current source 92.

Referring to FIGS. 13A through 13D, description will made about operation of the voltage controlled oscillator 46B illustrated in FIG. 12. FIG. 13A shows a waveform of an noninversion input terminal voltage Vn supplied to the noninversion input terminal of the comparator 100. FIG. 13B shows a waveform of an inversion input terminal voltage Vr supplied to the inversion input terminal of the comparator 100. The inversion input terminal voltage Vr is supplied to the drive voltage control circuit 60A (FIG. 10) as the chopping wave signal. FIG. 13C shows a waveform of a comparison output signal Vc produced by the comparator 100. FIG. 13D shows a waveform of the frequency control signal $V_{vco}$ produced at a connection node between the fifth constant current source 95 and the second switch 97.

It is assumed that the capacitor 105 charges no electric charge. In this event, the inversion input terminal voltage Vr has zero volt. Accordingly, the inversion input terminal voltage Vr is extremely lower than the noninversion input terminal voltage Vn and then the comparator 100 produces the comparison output signal Vc having a logic "H" level. While the comparison output signal Vc has the logic "H" level, the first through the third switches 96 to 98 are put into OFF state. As a result, the inversion input terminal voltage Vr and the frequency control signal $V_{vco}$ become high at constant rate.

It is assumed that the inversion input terminal voltage Vr reaches the noninversion input terminal voltage Vn. In this event, the comparator 100 produces the comparison output signal Vc having a logic "L" level. Accordingly, the first through the third switches 96 to 98 are put into ON state. As a result, the noninversion input terminal voltage Vn becomes a lower level because a voltage of the electric cell 106 is divided by the third and the fourth resistors 103 and 104. The sum of the first and the second constant currents flow in the capacitor 105 from the first and the second constant current sources 91 and 92 while the sum of the third and the fourth constant currents flow out the capacitor 105 to the third and the fourth constant current sources 93 and 94. Inasmuch as the sum of the third and the fourth constant currents is larger than the sum of the first and the second constant currents, the inversion input terminal voltage Vr becomes low at constant rate. Inasmuch as a fifth constant current obtained from the fifth constant current source 95 flows in a ground via the second switch 97, the frequency control signal $V_{vco}$ becomes zero volt.

It is assumed that the inversion input terminal voltage Vr is lower than the noninversion input terminal voltage Vn. In this event, the comparator 105 produces the comparison output signal Vc having the logic "H" level and then the first through the third switches 96 to 98 are put into the OFF state again. As a result, the inversion input terminal voltage Vr and the frequency control signal $V_{vco}$ become high at the constant rate again.

By repeating the above-mentioned operation, the voltage controlled oscillator 46B generates the chopping wave signal Vr and the frequency control signal $V_{vco}$. In addition, the voltage controlled oscillator 46B has an oscillation frequency which varies dependence on the integrated voltage produced by the integrator 33B.

Figure 14:
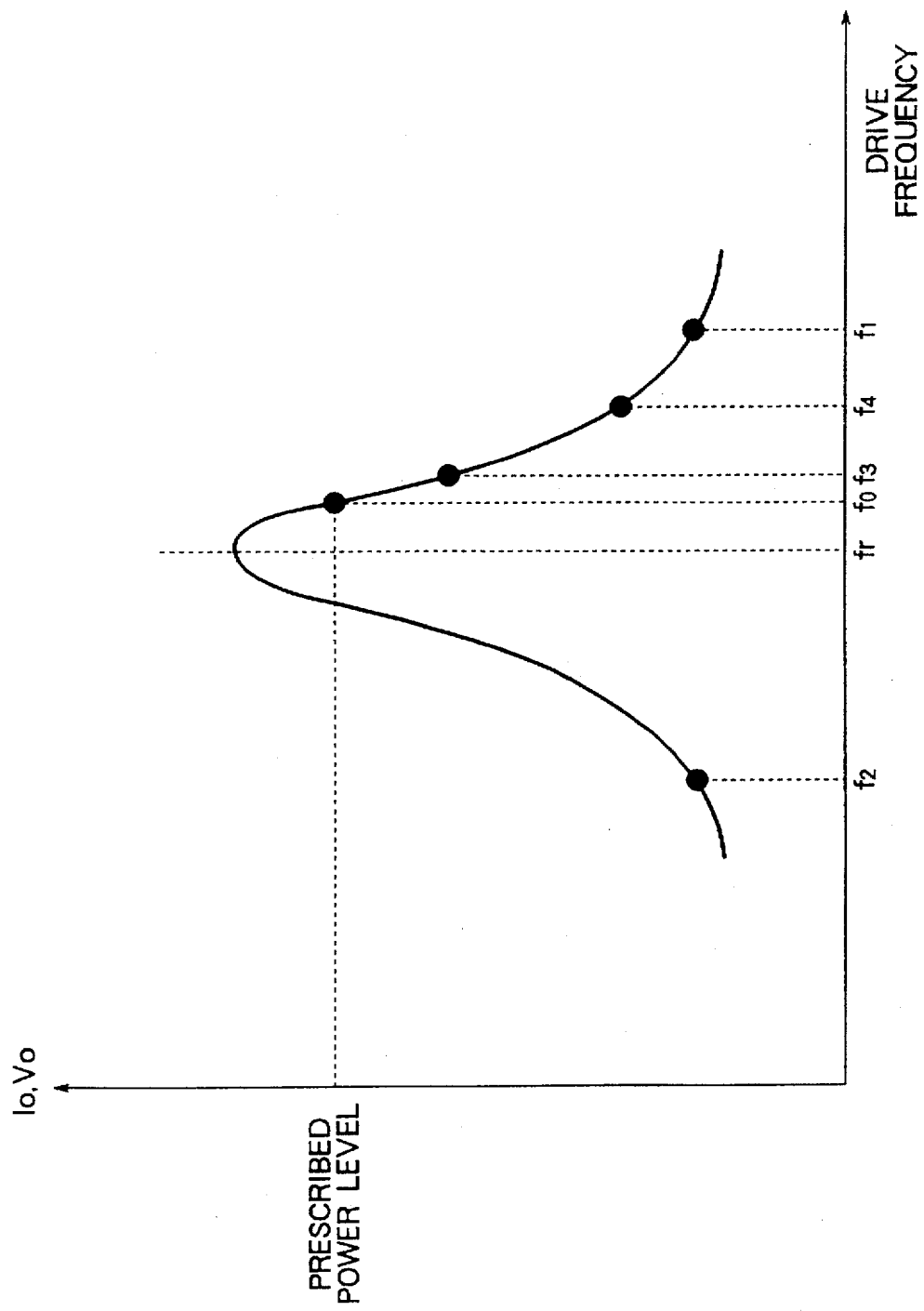
FIG. 14 shows a frequency characteristic of the piezoelectric transformer for use in describing operation of the frequency control circuit illustrated in FIG. 11.

FIG. 14 shows relationship between the drive frequency for the piezoelectric transformer 10 and an effective value or a power level of the output AC voltage Vo of the piezoelectric transformer 10 or the output AC current Io flowing the load 20. The abscissa and the ordinate represent the drive frequency of the piezoelectric transformer 10 and the power level of the output AC voltage Vo or the output AC current Io. The voltage controlled oscillator 46B has a frequency sweeping range for oscillation frequencies that is defined by the upper limit frequency f1 and the lower limit frequency f2. The upper limit frequency f1 of the voltage controlled oscillator 46B is determined the resistance value of the variable resistor 108 and a capacitance value of the capacitor 105. As described above, the variable resistor 108 includes the first and the second resistors 101 and 102 which are connected in parallel to each other wherein the first resistor 101 is grounded directly and the second resistor 102 is grounded via the fourth switch 99. The fourth switch 99 has the control terminal which is supplied with the switching signal Vp2 from the overvoltage protection circuit 80 (FIG. 10). When the switching signal Vp2 has a logic "H" level, the fourth switch 99 is turned OFF. The fourth switch 99 is turned ON when the switching signal Vp2 has a logic "L" level or when no signal is supplied to the control terminal of the fourth switch 99. When the control terminal of the fourth switch 99 is supplied with the switching signal Vp2 having the logic "H" level, the variable resistor 108 has the resistance value which is higher than that in a case when the control terminal of the fourth switch 99 is supplied with the switching signal Vp2 having the logic "L" level or no signal.

Figure 15:
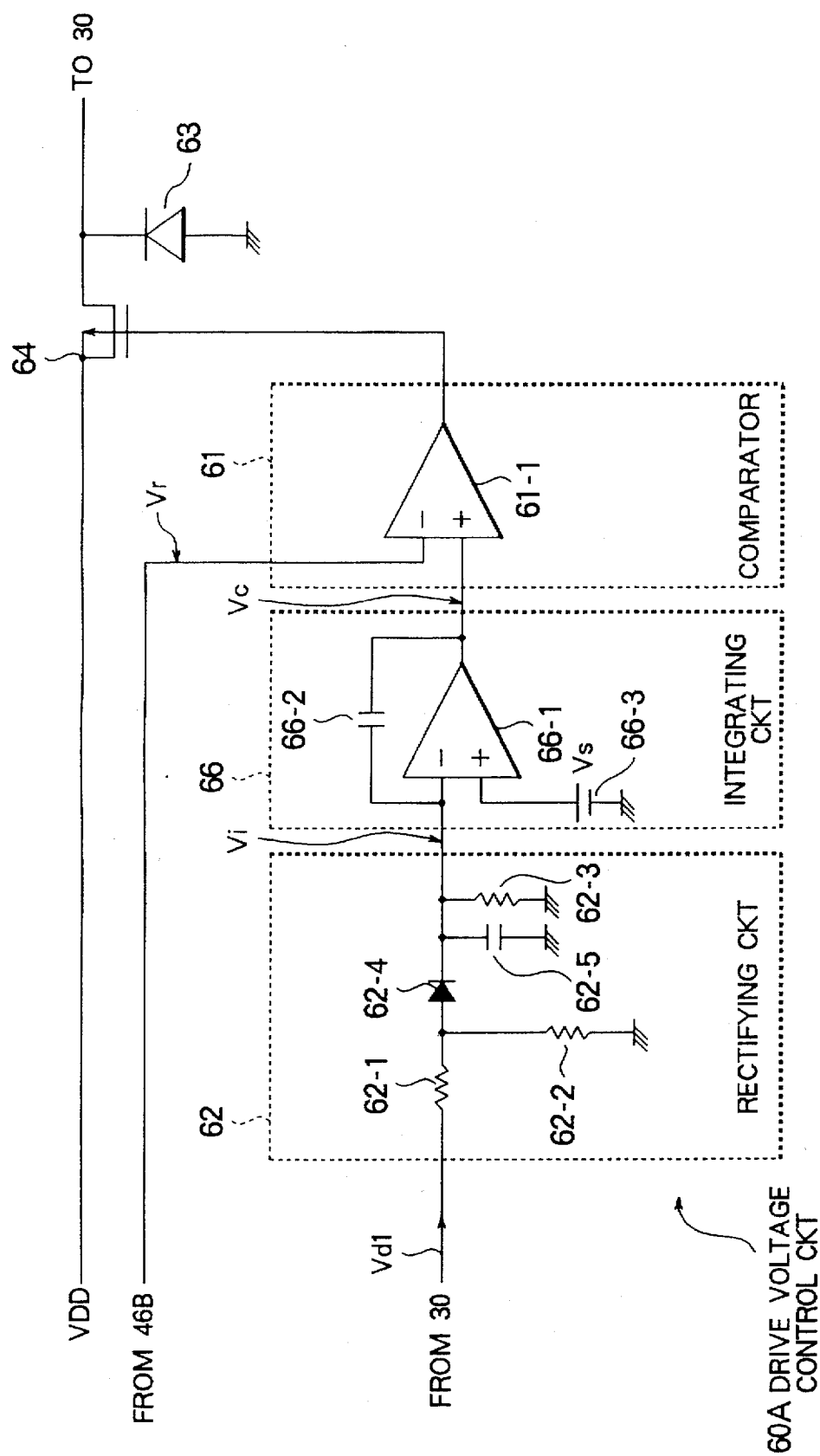
FIG. 15 shows a block diagram of a drive voltage control circuit for use in the drive circuit illustrated in FIG. 10.

Turning to FIG. 15, the drive voltage control circuit 60A comprises an integrating circuit 66 as well as the comparator 61, the rectifying circuit 62, the diode 63, and the power transistor 64. The power transistor 64 is a P-channel power MOSFET having gate, drain, and source electrodes. The source electrode of the P-channel power MOSFET 64 is supplied with the DC power source voltage $V_{DD}$ from the DC power source (not shown). The drain electrode of the P-channel power MOSFET 64 is connected to a cathode of the diode 63. The diode 64 has an anode which is grounded.

The drive voltage control circuit 60A controls the main drive voltage of the piezoelectric transformer 10 at a predetermined value by controlling so that peak current value of currents, which flow in the subsidiary transformers or the first and the second auto-transformers 31 and 32, is not varied depending on the DC power source voltage $V_{DD}$.

The comparator 61 is supplied with the chopping wave signal Vr from the voltage controlled oscillator 46B in the frequency control circuit 40B. The rectifying circuit 62 is supplied with the first drain voltage Vd1. The rectifying circuit 62 rectifies the first drain voltage Vd1 to produce a rectified voltage Vi.

Specifically, the rectifying circuit 62 comprises first through third resistors 62-1, 62-2, and 62-3, a diode 62-4, and a capacitor 62-5. A combination of the first and the second resistors 62-1 and 62-2 serves as a resistor potential divider section. A combination of the third resistor 62-3, the diode 62-4, and the capacitor 62-5 serves as a rectifier section. The resistor potential divider section divides the first drain voltage Vd1 to produce a divided voltage. The rectifier section rectifies the divided voltage into the rectified voltage Vi. The rectified voltage Vi is supplied to the integrating circuit 66.

The integrating circuit 66 integrates the rectified voltage Vi into an integrated voltage Vc. Specifically, the integrating circuit 66 comprises an operational amplifier 66-1, a capacitor 66-2, and an electric cell 66-3. The operational amplifier 66-1 has an inversion input terminal supplied with the rectified voltage Vi, a noninversion input terminal supplied with a cell voltage Vs from the electric cell 66-3, and an output terminal connected to the inversion input terminal via the capacitor 66-2. The integrating circuit 66 integrates a voltage difference between the rectified voltage Vi and the cell voltage Vs to produce the integrated voltage Vc. The integrated voltage Vc is supplied to the comparator 61.

The comparator 61 compares the chopping wave signal Vr with the integrated voltage Vc to produce a comparison result signal. Specifically, the comparator 61 consists of an operational amplifier 61-1. The operational amplifier 61-1 has an inversion input terminal supplied with the chopping wave signal Vr, a noninversion input terminal supplied with the integrated voltage Vc, and an output terminal for producing the comparison result signal. When the integrated voltage Vc is higher than the chopping wave signal Vr, the comparator 61 produces the comparison result signal having a logic "H" level. Otherwise, the comparator 61 produces the comparison result signal having a logic "L" level. The comparison result signal is supplied to the gate electrode of the transistor 64 as the gate voltage Vg3.

When the gate voltage Vg3 has the logic "H" level, the power transistor 64 is turned OFF to be put into OFF state between the source and the drain electrodes and then no power is supplied to the inverter circuit 30.

It is assumed that the first drain voltage Vd1 is low. In this event, the integrated voltage Vc becomes low. Accordingly, the power transistor 64 is put into an ON state for a long time and then a large input power is supplied to the inverter circuit 30. As a result, the first and the second drain voltages Vd1 and Vd2 become high and therefore the first and the second input voltages Vs1 and Vs2 become high.

Figure 16:
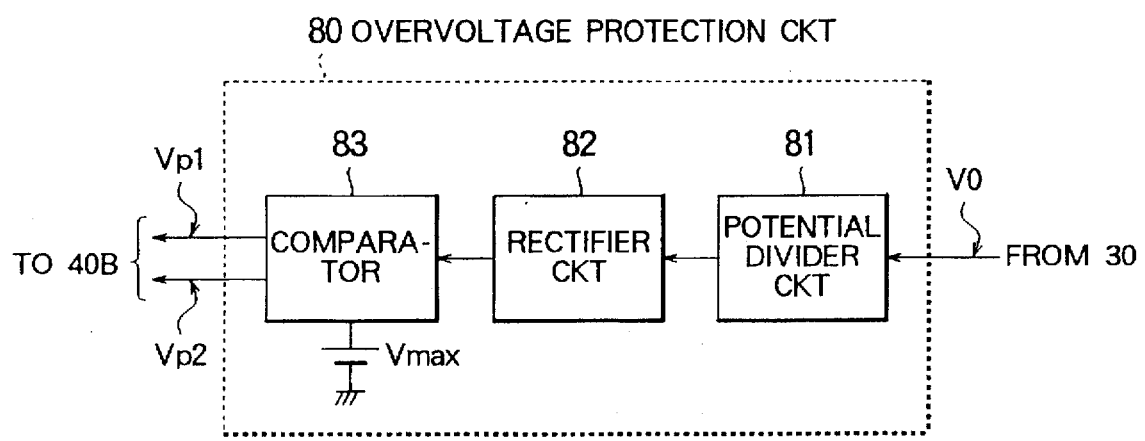
FIG. 16 shows a block diagram of an overvoltage protection circuit for use in the drive circuit illustrated in FIG. 10.

Turning to FIG. 16, the overvoltage protection circuit 80 comprises a potential divider circuit 81, a rectifying circuit 82, and a comparator 83. The potential divider circuit 81 is supplied with the output AC voltage Vo which is produced by the secondary electrode 12 of the piezoelectric transformer 10. The potential divider circuit 81 has a resistor ratio. The potential divider circuit 81 divides the output AC voltage Vo in accordance with the resistor ratio to produce a divided AC voltage. The divided AC voltage is supplied to the rectifying circuit 82. The rectifying circuit 82 rectifies the divided AC voltage into a DC voltage. The DC voltage is supplied to the comparator 83. The comparator 83 is supplied with a reference voltage Vmax. The comparator 83 compares the DC voltage with the reference voltage Vmax. When the DC voltage is higher than the reference voltage Vmax, the comparator 83 produces the additional reset signal Vp1 and the switching signal Vp2.

The additional reset signal Vp1 is supplied to the integrator 44B (FIG. 11) while the switching signal Vp2 is supplied to the fourth switch 99 in the voltage controlled oscillator 46B (FIG. 12). Responsive to the additional reset signal Vp1, the integrator 44B is reset to produce the lowest voltage as the integrated voltage. Responsive to the switching signal Vp2, the fourth switch 99 is put into the OFF state. The comparator 83 produces the switching signal Vp2 for a time duration equal to a time interval which takes the integrator 44B to shift the integrated voltage from the lowest voltage to the highest voltage. In addition, the resistor ratio of the potential divider circuit 81 is set such that the reference voltage Vmax is equal to the DC voltage obtained by rectifying the input AC voltage Vo having a particular amplitude level immediately before characteristic degradation occurs in the piezoelectric transformer 10 if the input AC voltage Vo exceeds the particular amplitude level.

Referring to FIGS. 10 through 16, description will made about operation of the drive circuit illustrated in FIG. 10. It is assumed that the load 20 is the cold-cathode tube. Inasmuch as the first and the second input voltages Vs1 and Vs2 are alternately supplied to the first and the second primary electrodes 11-1 and 11-2 of the piezoelectric transformer 10, respectively, the main drive voltage having an equivalently sinusoidal wave makes the piezoelectric transformer 10 vibrate. Accordingly, the secondary electrode 12 of the piezoelectric transformer 10 produces the output AC voltage Vo which is M times as large as the main drive voltage, where M represents the step-up ratio which is defined by the geometry of the piezoelectric transformer 10. The output AC voltage Vo is supplied to the load 20 and then the load current or the output AC current Io flows in the load 20. The load current Io is supplied to the frequency control circuit 40B as the feedback current.

Responsive to the feedback current Io, the frequency control circuit 40 supplies the two-phase drive circuit with the frequency control signal $V_{vco}$ for driving the piezoelectric transformer 10. The frequency control signal $V_{vco}$ indicates the drive frequency which lowers at the constant rate from the upper limit frequency f1 shown in FIG. 14. When the drive frequency reaches the prescribed frequency f0, the DC voltage supplied to the first comparator 43 is higher than the first reference voltage Vref1 and the first comparator 43 produces, as the first comparison result signal, a discharge path return signal indicative of making the integrator 44B return the discharge path. The discharge path return signal is supplied to the integrator 44B. Responsive to the discharge path return signal, the integrator 44B produces the integrated voltage which is kept at the voltage immediately before the discharge path returns and therefore the voltage controlled oscillator 46B oscillates the frequency control signal $V_{vco}$ and the chopping wave signal Vr indicating the drive frequency which is invariable. As a result, the piezoelectric transformer 10 is driven by the main drive voltage having a constant frequency.

It is assumed that the DC voltage supplied to the first comparator 43 is lower than the first reference voltage Vref1 because of variation in the feedback current Io for some reason or other such as variation of impedance of the cold-cathode tube after the piezoelectric transformer 10 is driven by the main drive voltage having the constant frequency. In this event, the first comparator 43 produces, as the first comparison result signal, the discharge path cutoff signal. Inasmuch as the integrator 44B produces, in response to the discharge path cutoff signal, the integrated voltage which becomes gradually high, the voltage controlled oscillator 46B oscillates the frequency control signal $V_{vco}$ and the chopping wave signal Vr indicating the drive frequency which becomes gradually low. When the drive frequency reaches the lower limit frequency f2 shown in FIG. 14, the integrator 44B produces the integrated voltage which is higher than the second reference voltage Vref2 and therefore the comparator 45 supplies the reset signal to the integrator 44B. Responsive to the reset signal, the integrator 44B is reset to produce the lowest voltage as the integrated voltage. Responsive to the lowest voltage, the voltage controlled oscillator 46B oscillates the frequency control signal $V_{vco}$ and the chopping wave signal Vr indicating the drive frequency which is equal to the upper limit frequency f1 shown in FIG. 14. The above mentioned operation is carried out repeatedly.

It will be assumed that the first comparator 43 detects the DC voltage produced by the rectifying circuit 42 that is equal to the first reference voltage Vref1 in the above-mentioned repeated operation. In this event, the integrator 44B holds the integrated voltage and therefore the oscillation frequency of the voltage controlled oscillator 46B is constant.

It is presumed that the cold-cathode tube 20 is put into an abnormal state where the cold-cathode tube 20 has a high impedance. In other words, the cold-cathode tube 20 serves as the above-mentioned abnormal-state cold-cathode tube. Such an abnormal state occurs when the cold-cathode tube 20 does not light up because of a low ambient air temperature or when the cold-cathode tube 20 is put into an open state due to cutoff and so on. Under the circumstances, the drive frequency continues to become low in the similar manner which is described above. When the drive frequency reaches the lower limit frequency f2 shown in FIG. 14, the drive frequency is shifted from the lower limit frequency f1 to the upper limit frequency f2 in the manner which is described above.

On the other hand, the amplitude of the output AC voltage Vo in the piezoelectric transformer 10 becomes large because the cold-cathode tube 20 has the high impedance. When the drive frequency reaches a frequency f3 shown in FIG. 14 that is laid in a frequency range between the prescribed frequency f0 and the upper limit frequency f1, the comparator 83 in the overvoltage protection circuit 80 is supplied from the rectifier circuit 82 with the rectified voltage which is higher than the reference voltage Vmax. Accordingly, the comparator 83 produces the additional reset signal Vp1 and the switching signal Vp2.

Responsive to the switching signal Vp2, the fourth switch 99 in the voltage controlled oscillator 46B is turned OFF and it results in increasing the resistance value of the variable resistor 108. On the other hand, the integrator 44B is reset, in response to the additional reset signal Vp1, to produce the lowest voltage as the integrated voltage. Responsive to the lowest voltage, the voltage controlled oscillator 46B oscillates the frequency control signal $V_{vco}$ and the chopping wave signal Vr indicative of the drive frequency equal to a frequency f4 in place of the upper limit frequency f1. This is because the variable resistor 108 has the large resistance value. The frequency f4 is lower than the upper limit frequency f1. Accordingly, the drive frequency is shifted from the frequency f4 downward and then the above-mentioned operation is carried out repeatedly.

Herein, the frequency f3 is called a provisional or save lower limit frequency while the lower limit frequency f2 may be a normal lower limit frequency in order to distinguish from the provisional lower limit frequency f3. Likewise, the frequency f4 is called a provisional or save upper limit frequency while the upper limit frequency f1 may be a normal upper limit frequency in order to distinguish from the provisional upper limit frequency f4.

As described above, the voltage controlled oscillator 46B has a normal frequency sweeping range which is defined between the normal upper limit frequency f1 and the normal lower limit frequency f2 when the cold-cathode tube 20 acts as the normal-state cold-cathode tube. On the contrary, the voltage controlled oscillator 46B has a provisional or save frequency sweeping range which is defined between the provisional upper limit frequency f4 and the provisional lower limit frequency f3 when the cold-cathode tube 20 acts as the abnormal-state cold-cathode tube. The provisional or save frequency sweeping range is included in the normal frequency sweeping range. Accordingly, the upper limit frequency in the frequency sweeping is shifted from the normal upper limit frequency f1 to the provisional upper limit frequency f4 which is lower than the normal upper limit frequency f1 when the voltage controlled oscillator 46B carries out operation of the frequency sweeping forever or for the long time interval in a case where the cold-cathode tube 20 is operable as the abnormal-state cold-cathode tube.

FIG. 9C shows a waveform of the first drain voltage Vd1 with the first clock signal Vg1 in a case where the drive frequency is equal to the provisional upper limit frequency f4. As shown in FIG. 9C, when the drive frequency is equal to the provisional upper limit frequency f4, each of the first and the second drain voltages Vd1 and Vd2 has a relatively low level immediately before zero switching in comparison with a case where the drive frequency is equal to the normal upper limit frequency f1 shown in FIG. 9B. Accordingly, the peak value of the currents flowing in the first and the second auto-transformers 31 and 32 and in the first and the second switching transistors 36 and 37 becomes low on inversion of the first and the second clock signals Vg1 and Vg2 when the cold-cathode tube 20 serves as the abnormal-state cold-cathode tube as compared with the conventional drive circuits for the piezoelectric transformer 10. As a result, it is possible to decrease heat developed from the first and the second auto-transformers 31 and 32 and the first and the second switching transistors 36 and 37.

Figure 17:
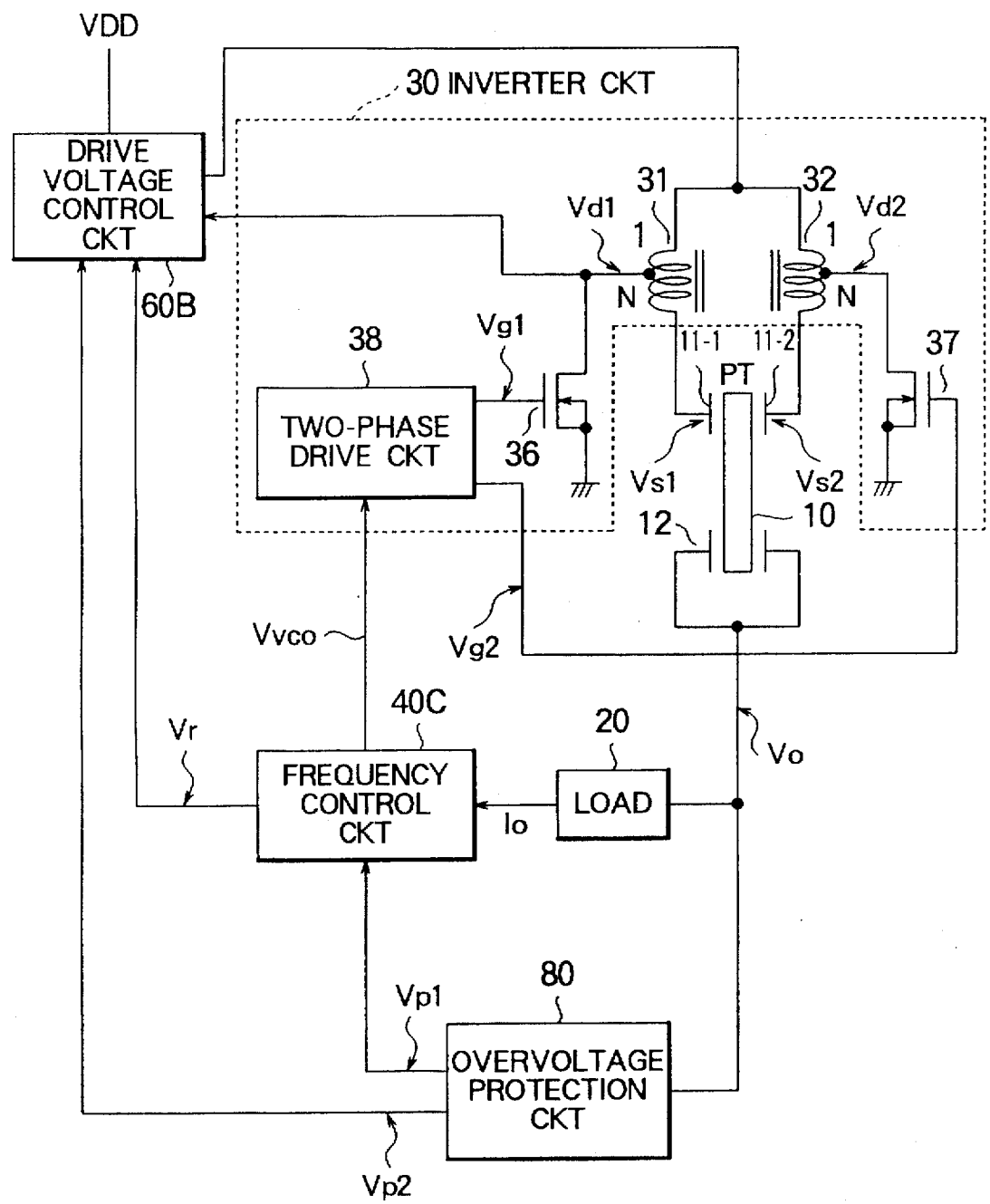
FIG. 17 shows a block diagram of a drive circuit for a piezoelectric transformer according to a second embodiment of this invention.

Referring to FIG. 17, the description will proceed to a drive circuit for the piezoelectric transformer (PT) 10 according to a second embodiment of this invention. The illustrated drive circuit is similar in structure to that illustrated in FIG. 10 except that the frequency control circuit and the drive voltage control circuit are modified to be different from those described in conjunction with FIG. 10 as will later become clear. The frequency control circuit and the drive voltage control circuit are therefore depicted at 40C and 60B, respectively.

In the drive circuit illustrated in FIG. 17, the additional reset signal Vp1 only is supplied to the frequency control circuit 40C from the overvoltage protection circuit 80. In addition, the switching signal Vp2 is supplied to the drive voltage control circuit 60B in lieu of the frequency control circuit 40C.

Figure 18:
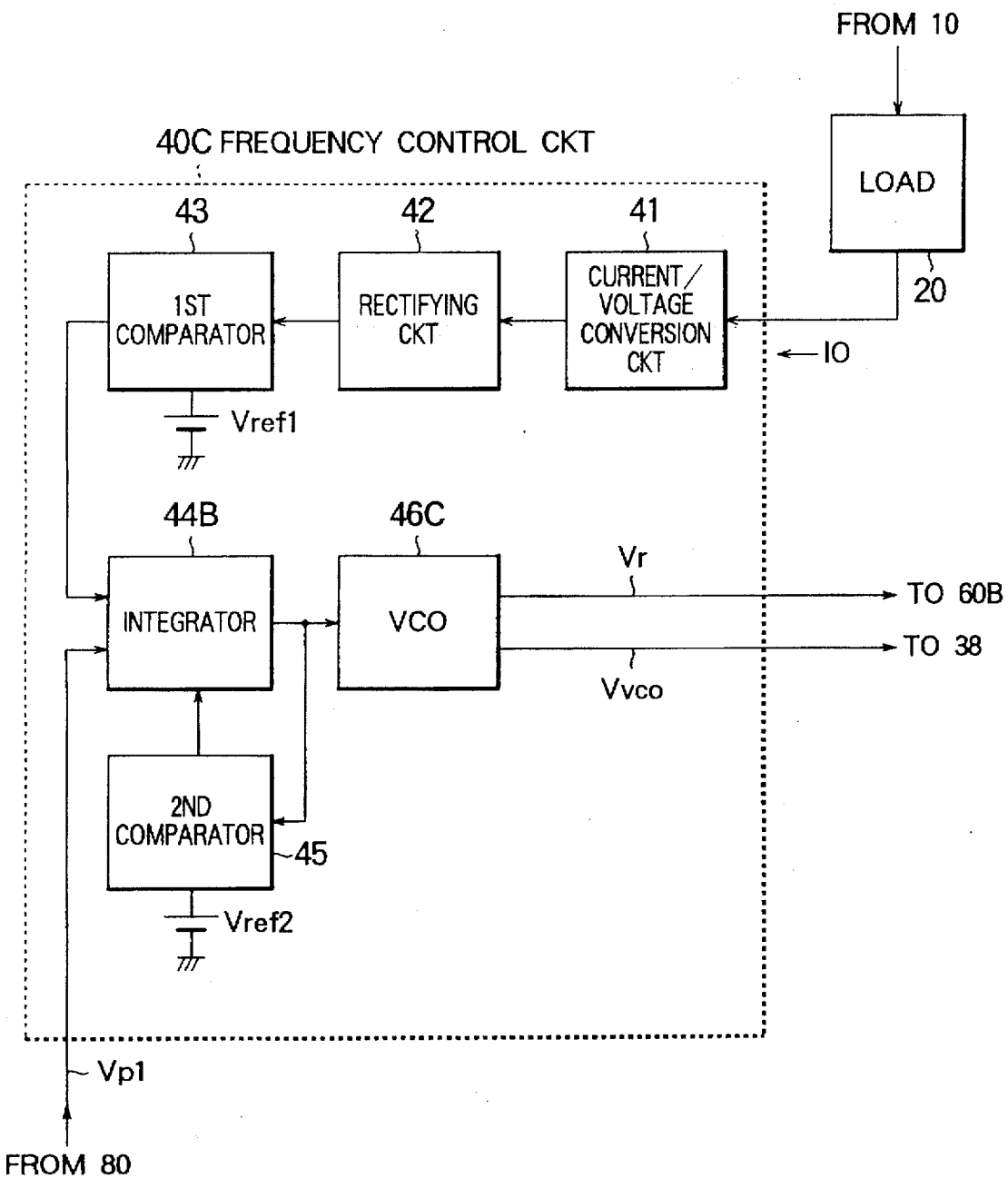
FIG. 18 shows a block diagram of a frequency control circuit for use in the drive circuit illustrated in FIG. 17.

Turning to FIG. 18, the frequency control circuit 40C is similar in structure to the frequency control circuit 40B illustrated in FIG. 11 except that the voltage controlled oscillator is modified to be different from that described in conjunction with FIG. 11 as will later become clear. The voltage controlled oscillator is therefore depicted at 46C. As shown in FIG. 18, the voltage controlled oscillator 46C is not supplied with the switching signal Vp2 although the voltage controlled oscillator 46B shown in FIG. 11 is supplied with the switching signal Vp2.

Figure 19:
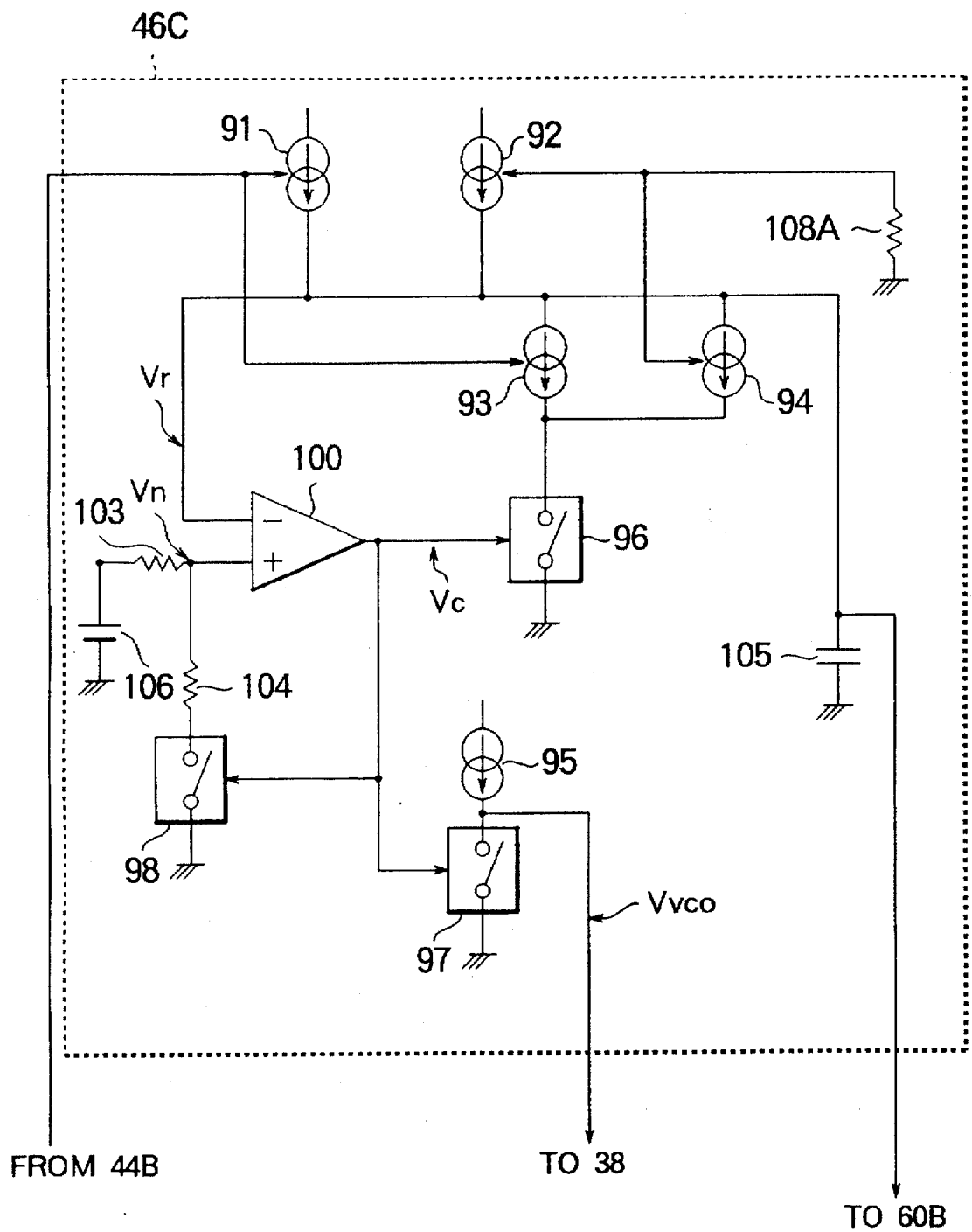
FIG. 19 shows a block diagram of a voltage controlled oscillator for use in the frequency control circuit illustrated in FIG. 18.

Turning to FIG. 19, the voltage controlled oscillator 46C is similar in structure to the voltage controlled oscillator 46B illustrated in FIG. 12 except that the voltage controlled oscillator 46C comprises a fixed resistor 108A on behalf of the variable resistor 108 used in the voltage controlled oscillator 46B illustrated in FIG. 12.

Figure 20:
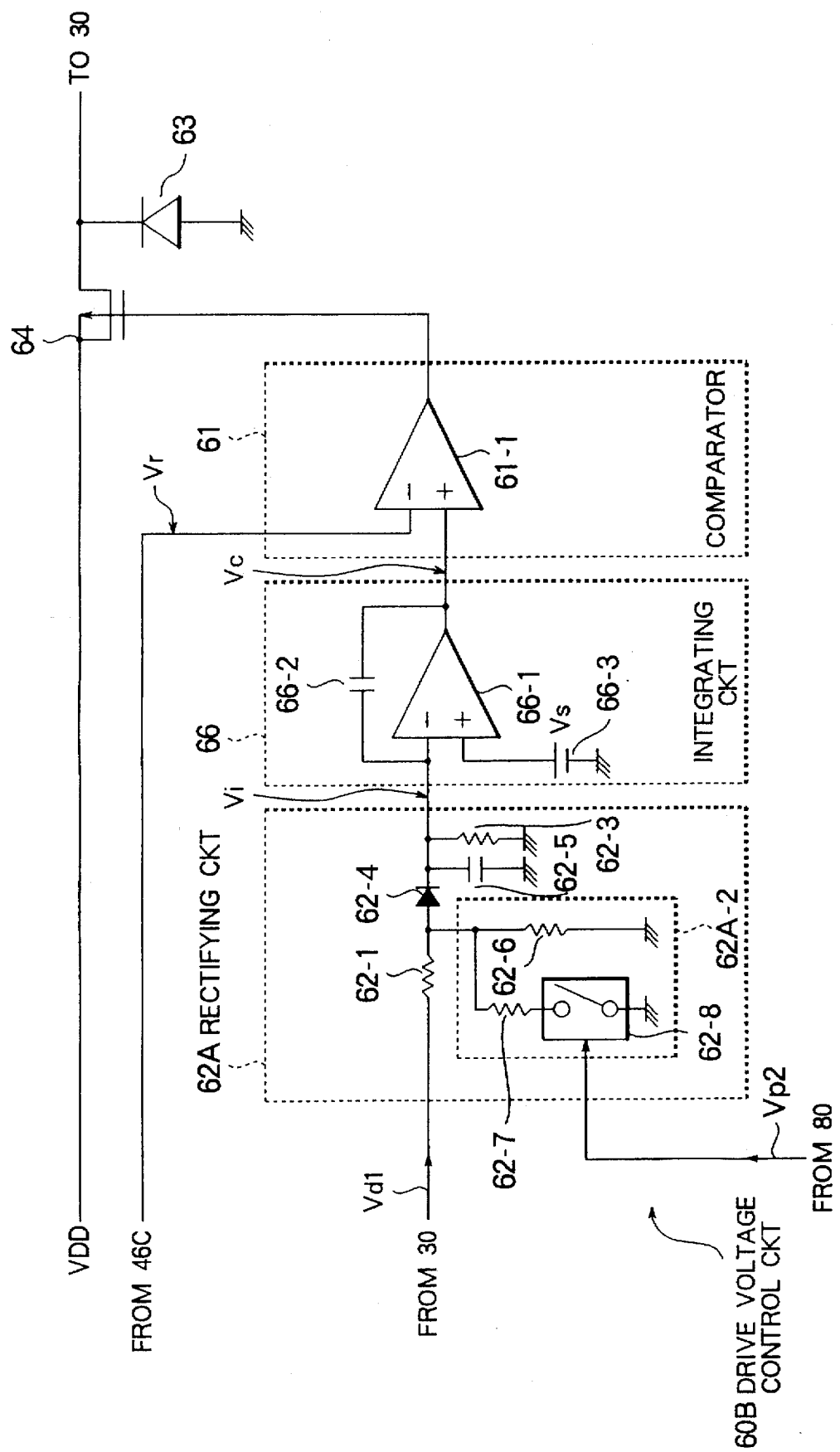
FIG. 20 shows a block diagram of a drive voltage control circuit for use in the drive circuit illustrated in FIG. 17.

Turning to FIG. 20, the drive voltage control circuit 60B is similar in structure to the drive voltage control circuit 60A illustrated in FIG. 15 except that the rectifying circuit is modified to be different from that described in conjunction with FIG. 15 as will later become clear. The rectifying circuit is therefore depicted at 62A.

The rectifying circuit 62A is similar in structure to the rectifying circuit 62 illustrated in FIG. 15 except that the rectifying circuit 62A comprises a variable resistor 62A-2 in place of the fixed resistor 62-2 used in the rectifying circuit 62 illustrated in FIG. 15. The variable resistor 62A-2 is composed of two resistors 62-6 and 62-7 and a switch 62-8. The resistors 62-6 and 62-7 are connected in parallel to each other. The resistor 62-6 is grounded directly while the resistor 62-7 is grounded via the switch 62-8. The switch 62-8 has a control terminal which is supplied with the switching signal Vp2 from the overvoltage protection circuit 80 (FIG. 17). When the switching signal Vp2 is present or has the logic "H" level, the switch 62-8 is turned OFF. When the switching signal Vp2 is absent or has the logic "L" level, the switch 62-8 is turned ON.

With this structure, the rectifying circuit 63A has a variable resistance ratio while the rectifying circuit 63 illustrated in FIG. 15 has a fixed resistance ratio. Even through the first drain voltage Vd1 is invariable, the rectified voltage Vi varies by changing the variable resistance ratio, the integrated voltage Vc also varies and then a duty factor of the gate voltage Vg3 is changed. As a result, it is possible to vary the input power to the inverter circuit 30.

Referring to FIGS. 17 through 20 in addition to FIG. 14, description will made about operation of the drive circuit illustrated in FIG. 17. It is assumed that the load 20 is the cold-cathode tube. While the cold-cathode tube 20 is operable as the normal-state cold-cathode tube, the voltage controlled oscillator 46C has the normal frequency sweeping range defined between the normal upper limit frequency f1 and the normal lower limit frequency f2 in the similar manner described in conjunction with FIGS. 10 through 16.

It is assumed that the cold-cathode tube 20 is put into the abnormal state for some reason or other. In this event, the DC voltage supplied to the first comparator 43 is lower than the first reference voltage Vref1 because the feedback current Io decreases. Accordingly, the first comparator 43 produces the discharge path cutoff signal as the first comparison result signal. Responsive to the discharge path cutoff signal, the integrator 44B produces the integrated voltage which becomes gradually high. As a result, the drive frequency becomes gradually low. When the drive frequency reaches the normal lower limit frequency f2 shown in FIG. 14, the integrator 44B produces the integrated voltage which is higher than the second reference voltage Vref2 and therefore the comparator 45 supplies the reset signal to the integrator 44B. Responsive to the reset signal, the integrator 44B is reset to produce the lowest voltage as the integrated voltage. Accordingly, the drive frequency is shifted from the normal lower limit frequency f2 to the normal upper limit frequency f1 and thereafter the drive frequency is shifted from the normal upper limit frequency f1 downward. On the other hand, the amplitude of the output voltage Vo in the piezoelectric transformer 10 becomes large because the abnormal-state cold-cathodes tube 20 has the high impedance. When the drive frequency reaches the provisional lower limit frequency f3 which is higher than the prescribed frequency f0, the overvoltage protection circuit 80 detects overvoltage in the output AC voltage Vo to produce the additional reset signal Vp1 and the switching signal Vp2.

Responsive to the additional reset signal Vp1, the integrator 44B is reset to produce the lowest voltage as the integrated voltage. Accordingly, the drive frequency is shifted from the provisional lower limit frequency f3 to the normal upper limit frequency f1. Thereafter, the drive frequency is shifted from the normal upper limit frequency f1 and then the above-mentioned operation is repeated. On the other hand, the switch 62-8 in the rectifying circuit 62A is turned OFF in response to the switching signal Vp2 and it results in increasing the resistance value of the variable resistor 62A-2. Accordingly, the rectified voltage Vi produced by the rectifying circuit 62A becomes high and then the integrated voltage Vc produced by the integrating circuit 66 becomes also high. As a result, the duty factor of the gate voltage Vg3 increases, the transistor 64 is put into OFF state for a longer time, and a less input power is supplied to the inverter circuit 30. Therefore, the peak voltage value of the first and the second drain voltages Vd1 and Vd2 decreases.

Consequently, each of the first and the second drain voltages Vd1 and Vd2 has a relatively low level immediately before zero switching on inversion of the first and the second clock signals at about the normal upper limit frequency f1. Accordingly, the peak value of the currents flowing in the first and the second auto-transformera 31 and 32 and in the first and the second switching transistors 36 and 37 becomes low on inversion of the first and the second clock signals Vg1 and Vg2 when the cold-cathode tube 20 serves as the abnormal-state cold-cathode tube as compared with the conventional drive circuits for the piezoelectric transformer 10. As a result, it is possible to decrease heat developed from the first and the second auto-transformers 31 and 32 and the first and the second switching transistors 36 and 37.

Figure 21:
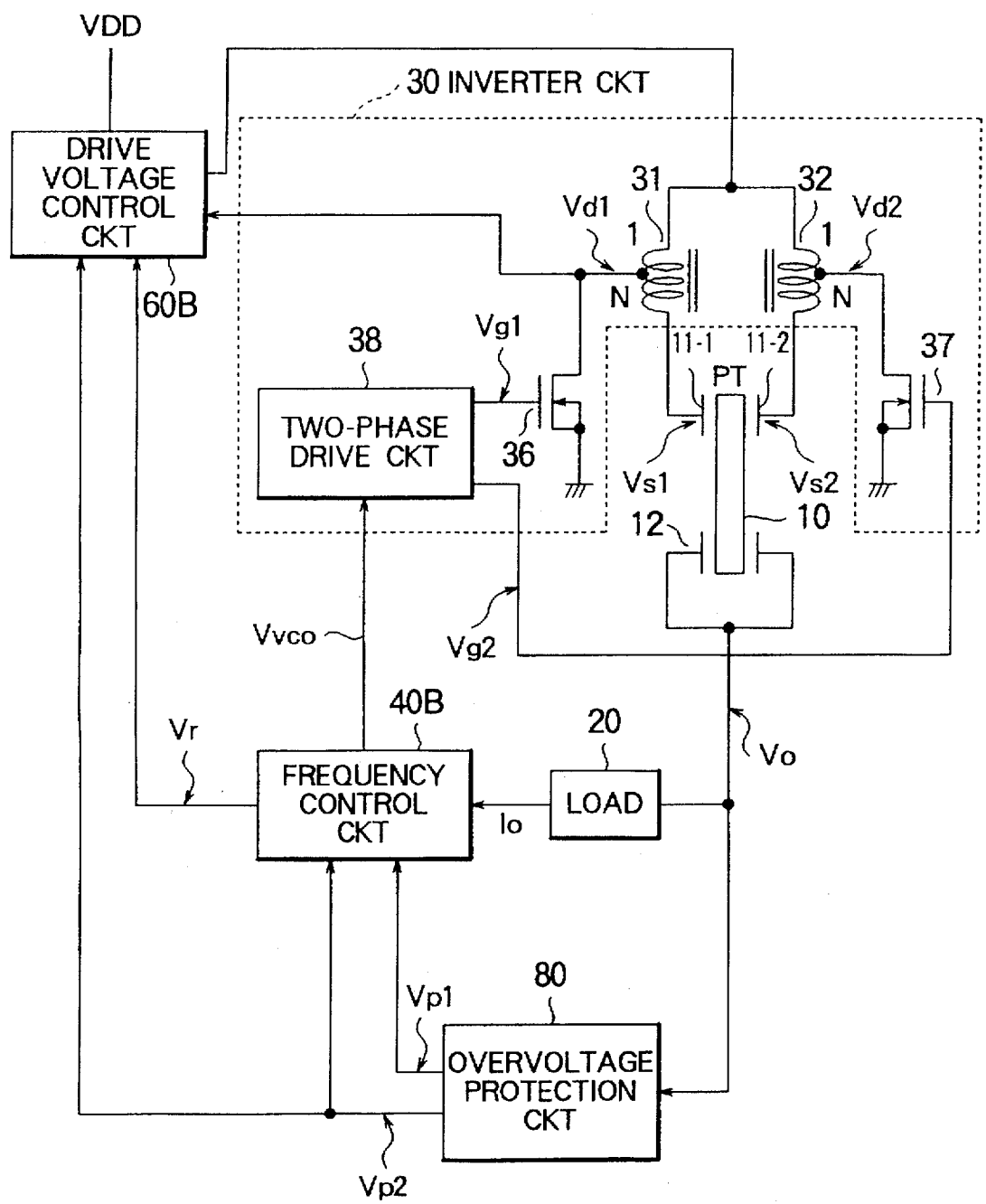
FIG. 21 shows a block diagram of a drive circuit for a piezoelectric transformer according to a third embodiment of this invention.

Referring to FIG. 21, the description will proceed to a drive circuit for the piezoelectric transformer (PT) 10 according to a third embodiment of this invention. The illustrated drive circuit has structure so as to combine the drive circuit illustrated in FIG. 10 with the drive circuit illustrated in FIG. 17. That is, the illustrated drive circuit comprises the inverter circuit 30, the overvoltage protection circuit 80, the frequency control circuit 40B used in the drive circuit illustrated in FIG. 10, and the drive voltage control circuit 60B used in the drive circuit illustrated in FIG. 17. The switching signal Vp2 is supplied to both of the frequency control circuit 40B and the drive voltage control circuit 60B. In other words, the switching signal Vp2 controls ON and OFF of both of the fourth switch 99 in the voltage controlled oscillator 46B of the frequency control circuit 40B and the switch 62-8 in the rectifying circuit 62A of the drive voltage control circuit 60B.

With this structure, when the overvoltage protection circuit 80 detects overvoltage in the output AC voltage Vo, not only the fourth switch 99 in the voltage controlled oscillator 46B is turned off to shift the upper limit frequency in the frequency sweeping range from the normal upper limit frequency f1 to the provisional upper limit frequency f4 lower than the normal upper limit frequency f1 but also the switch 62-8 in the rectifying circuit 62A is turned off to decrease the input power supplied to the inverter circuit 30. As a result, it is possible to decrease heat developed from the first and the second auto-transformers 31 and 32 and the first and the second switching transistors 36 and 37 when the cold-cathode tube 20 is put into the abnormal state.

While this invention has thus far been described in conjunction with preferred embodiments thereof, it will now be readily possible for those skilled in the art to put this invention into various other manners. For example, the subsidiary transformer may be a general electromagnetic transformer instead of the auto-transformer.

What is claimed is:

1. A drive circuit for driving a piezoelectric transformer acting as a main transformer, said piezoelectric transformer having a resonance frequency, said piezoelectric transformer having first and second primary electrodes supplied with an input AC voltage, said piezoelectric transformer converting the input AC voltage into an output AC voltage by the use of piezoelectric effect, said piezoelectric transformer having a secondary electrode for supplying the output AC voltage to a load, said drive circuit comprising:

an inverter circuit, supplied with an input DC voltage having controllable input power and with a frequency control signal and connected to the first and the second primary electrodes of said piezoelectric transformer, for converting the input DC voltage into a main drive voltage in response to the frequency control signal, said inverter circuit supplying the first and the second primary electrodes of said piezoelectric transformer with the main drive voltage as the input AC voltage, said inverter circuit including first and second subsidiary transformers supplied with first and second subsidiary drive voltages, respectively;

a frequency control circuit, supplied with a load current flowing in the load as a feedback current, for controlling a drive frequency for said piezoelectric transformer in response to the feedback current, said frequency control circuit having a normal frequency sweeping range defined between a normal upper limit frequency and a normal lower limit frequency, the normal frequency sweeping range including the resonance frequency, said frequency control circuit sweeping the drive frequency within the normal frequency sweeping range, said frequency control circuit being reset in response to a reset signal to shift the drive frequency from the normal lower limit frequency to the normal upper limit frequency, said frequency control circuit producing the frequency control signal and a chopping wave signal which indicate the drive frequency;

a drive voltage control circuit, supplied with a DC power source voltage and connected to said inverter circuit and said frequency control circuit, for controlling, in response to the chopping wave signal and the first subsidiary drive voltage, the input power of the input DC voltage so as to keep the first subsidiary drive voltage at a predetermined peak value; and an overvoltage protection circuit, connected to the secondary electrode of said piezoelectric transformer and said frequency control circuit, for detecting overvoltage in the output AC voltage, said overvoltage protection circuit supplying said frequency control circuit with an additional reset signal and a switching signal on detection of the overvoltage in the output AC voltage, thereby making said frequency control circuit switch the normal frequency sweeping range to a provisional frequency sweeping range defined between a provisional lower limit frequency higher than the resonance frequency and a provisional upper limit frequency lower than the normal upper limit frequency.

2. A drive circuit as claimed in claim 1, wherein said inverter circuit comprises:

a first auto-transformer acting as the first subsidiary transformer, said first auto-transformer having a first primary winding and a first secondary winding which are connected to each other at a first intermediate terminal supplied with the first subsidiary drive voltage, the first primary winding having a first primary terminal supplied with the input DC voltage, the first secondary winding having a first secondary terminal connected to the first primary electrode of said piezoelectric transformer;

a first switching transistor having a first control terminal and a first output terminal for supplying the first subsidiary drive voltage to the first intermediate terminal of said first auto-transformer;

a second auto-transformer acting as the second subsidiary transformer, said second auto-transformer having a second primary winding and a second secondary winding which are connected to each other at a second intermediate terminal supplied with the second subsidiary drive voltage, the second primary winding having a second primary terminal supplied with the input DC voltage, the second secondary winding having a second secondary terminal connected to the second primary electrode of said piezoelectric transformer;

a second switching transistor having a second control terminal and a second output terminal for supplying the second subsidiary drive voltage to the second intermediate terminal of said first auto-transformer; and a two-phase drive circuit, connected to said frequency control circuit and said first and said second switching transistors, for alternately driving, in response to the frequency control signal, said first and said second switching transistors by supplying the first and the second control terminals of said first and said second switching transistors with first and second clock signals which have reversed phase each other.

3. A drive circuit as claimed in claim 2, wherein said first switching transistor is a first N-channel field effect transistor having a first gate electrode serving as the first control terminal, a first drain electrode serving as the first output terminal, the first drain electrode producing a first drain voltage as the first subsidiary drive voltage, and a first source electrode which is grounded, said second switching transistor being a second N-channel field effect transistor having a second gate electrode serving as the second control terminal, a second drain electrode serving as the second output terminal, the second drain electrode producing a second drain voltage as the second subsidiary drive voltage, and a second source electrode which is grounded.

4. A drive circuit as claimed in claim 1, wherein said frequency control circuit comprises:

a current/voltage conversion circuit, connected to the load, for converting the feedback current into a feedback voltage;

a rectifying circuit, connected to said current/voltage conversion circuit, for rectifying the feedback voltage to produce a DC voltage;

a first comparator, connected to said rectifying circuit and supplied with a first reference voltage, for comparing the DC voltage with the first reference voltage to produce a first comparison result signal;

an integrator, having the lowest voltage as an initial voltage and connected to said first comparator and said overvoltage protection circuit, for carrying out integration operation in response to the first comparison result signal to produce an integrated voltage which becomes gradually high during the first comparison result signal indicates that the DC voltage is lower than the first reference voltage, said integrator being reset in response to the reset signal and the additional reset signal to produce the lowest voltage as the integrated voltage;

a second comparator, connected to said integrator and supplied with a second reference voltage higher than the lowest voltage, for comparing the integrated voltage with the second reference voltage to produce the reset signal when the integrated voltage reaches the second reference voltage; and a voltage controlled oscillator, connected to said integrator, said inverter circuit, and said drive voltage control circuit, for oscillating the frequency control signal and the chopping wave signal indicative of the drive frequency which is inversely proportional to a voltage level of the integrated voltage, the drive frequency being equal to the normal lower limit frequency when the integrated voltage is equal to the second reference voltage, the drive frequency being equal to the normal upper limit frequency when the integrated voltage is equal to the lowest voltage in a case where the switching signal is absent, the drive frequency being equal to the provisional upper limit frequency when the integrated voltage is equal to the lowest voltage in a case where the switching signal is present.

5. A drive circuit as claimed in claim 1, wherein said drive voltage control circuit comprises:

a rectifying circuit, connected to said inverter circuit and having a fixed resistance ratio, for rectifying the first subsidiary drive voltage on the basis of the fixed resistance ratio to produce a rectified voltage;

an integrating circuit, connected to said rectifying circuit and having a cell voltage, for integrating a voltage difference between the rectified voltage and the cell voltage to produce an integrated voltage;

a comparator, connected to said integrating circuit and said frequency control circuit, for comparing the chopping wave signal with the integrated voltage to produce a comparison result signal, said comparator producing the comparison result signal having a logic "H" level when the integrated voltage is higher than the chopping wave signal, said comparator producing the comparison result signal having a logic "L" level when the integrated voltage is lower than the chopping wave signal;

a power transistor having a control electrode supplied the comparison result signal, an input electrode supplied with the DC power source voltage, and an output electrode producing the input DC voltage, said power transistor being turned off when the comparison result signal has the logic "H" level, said power transistor being turned on when the comparison result signal has the logic "L" level; and a diode having a cathode connected to the output electrode and an anode which is grounded.

6. A drive circuit as claimed in claim 5, wherein said power transistor is a P-channel power MOSFET having gate, source, and drain electrodes which are operable as the control, the input, and the output electrodes, respectively.

7. A drive circuit as claimed in claim 1, wherein said said overvoltage protection circuit comprises:

a potential divider circuit, having a resistor ratio and connected to the secondary electrode of said piezoelectric transformer, for dividing the output AC voltage in accordance with the resistor ratio to produce a divided AC voltage;

a rectifying circuit, connected to said potential divider circuit, for rectifying the divided AC voltage into a DC voltage; and a comparator, supplied with a reference voltage and connected to said rectifying circuit and said frequency control circuit, for comparing the DC voltage with the reference voltage, said comparator supplying said frequency control circuit with the additional reset signal and the switching signal when the DC voltage is higher than the reference voltage.

8. A drive circuit for driving a piezoelectric transformer acting as a main transformer, said piezoelectric transformer having a resonance frequency, said piezoelectric transformer having first and second primary electrodes supplied with an input AC voltage, said piezoelectric transformer converting the input AC voltage into an output AC voltage by the use of piezoelectric effect, said piezoelectric transformer having a secondary electrode for supplying the output AC voltage to a load, said drive circuit comprising:

an inverter circuit, supplied with an input DC voltage having controllable input power and with a frequency control signal and connected to the first and the second primary electrodes of said piezoelectric transformer, for converting the input DC voltage into a main drive voltage in response to the frequency control signal, said inverter circuit supplying the first and the second primary electrodes of said piezoelectric transformer with the main drive voltage as the input AC voltage, said inverter circuit including first and second subsidiary transformers supplied with first and second subsidiary drive voltages, respectively;

a frequency control circuit, supplied with a load current flowing in the load as a feedback current, for controlling a drive frequency of said piezoelectric transformer in response to the feedback current, said frequency control circuit having a normal frequency sweeping range defined between a normal upper limit frequency and a normal lower limit frequency, the normal frequency sweeping range including the resonance frequency, said frequency control circuit sweeping the drive frequency within the normal frequency sweeping range, said frequency control circuit being reset in response to a reset signal to shift the drive frequency from the normal lower limit frequency to the normal upper limit frequency, said frequency control circuit producing the frequency control signal and a chopping wave signal which indicate the drive frequency;

a drive voltage control circuit, supplied with a DC power source voltage and connected to said inverter circuit and said frequency control circuit, for controlling, in response to the chopping wave signal and the first subsidiary drive voltage, the input power of the input DC voltage so as to keep the first subsidiary drive voltage at a predetermined peak value; and an overvoltage protection circuit, connected to the secondary electrode of said piezoelectric transformer, said frequency control circuit, and said drive voltage control circuit, for detecting overvoltage in the output AC voltage, said overvoltage protection circuit supplying, on detection of the overvoltage in the output AC voltage, said frequency control circuit and said drive voltage control circuit with an additional reset signal and a switching signal, respectively, thereby making said frequency control circuit switch from the normal frequency sweeping range to a provisional frequency sweeping range defined between the normal upper limit frequency and a provisional lower limit frequency higher than the resonance frequency and making said drive voltage control circuit decrease the input power of the input DC voltage.

9. A drive circuit as claimed in claim 8, wherein said inverter circuit comprises:

a first auto-transformer acting as the first subsidiary transformer, said first auto-transformer having a first primary winding and a first secondary winding which are connected to each other at a first intermediate terminal supplied with the first subsidiary drive voltage, the first primary winding having a first primary terminal supplied with the input DC voltage, the first secondary winding having a first secondary terminal connected to the first primary electrode of said piezoelectric transformer;

a first switching transistor having a first control terminal and a first output terminal for supplying the first subsidiary drive voltage to the first intermediate terminal of said first auto-transformer;

a second auto-transformer acting as the second subsidiary transformer, said second auto-transformer having a second primary winding and a second secondary winding which are connected to each other at a second intermediate terminal supplied with the second subsidiary drive voltage, the second primary winding having a second primary terminal supplied with the input DC voltage, the second secondary winding having a second secondary terminal connected to the second primary electrode of said piezoelectric transformer;

a second switching transistor having a second control terminal and a second output terminal for supplying the second subsidiary drive voltage to the second intermediate terminal of said first auto-transformer; and a two-phase drive circuit, connected to said frequency control circuit and said first and said second switching transistors, for alternately driving, in response to the frequency control signal, said first and said second switching transistors by supplying the first and the second control terminals of said first and said second switching transistors with first and second clock signals which have reversed phase each other.

10. A drive circuit as claimed in claim 9, wherein said first switching transistor is a first N-channel field effect transistor having a first gate electrode serving as the first control terminal, a first drain electrode serving as the first output terminal, the first drain electrode producing a first drain voltage as the first subsidiary drive voltage, and a first source electrode which is grounded, said second switching transistor being a second N-channel field effect transistor having a second gate electrode serving as the second control terminal, a second drain electrode serving as the second output terminal, the second drain electrode producing a second drain voltage as the second subsidiary drive voltage, and a second source electrode which is grounded.

11. A drive circuit as claimed in claim 8, wherein said frequency control circuit comprises:

a current/voltage conversion circuit, connected to the load, for converting the feedback current into a feedback voltage;

a rectifying circuit, connected to said current/voltage conversion circuit, for rectifying the feedback voltage to produce a DC voltage;

a first comparator, connected to said rectifying circuit and supplied with a first reference voltage, for comparing the DC voltage with the first reference voltage to produce a first comparison result signal;

an integrator, having the lowest voltage as an initial voltage and connected to said first comparator and said overvoltage protection circuit, for carrying out integration operation in response to the first comparison result signal to produce an integrated voltage which becomes gradually high during the first comparison result signal indicates that the DC voltage is lower than the first reference voltage, said integrator being reset in response to the reset signal and the additional reset signal to produce the lowest voltage as the integrated voltage;

a second comparator, connected to said integrator and supplied with a second reference voltage higher than the lowest voltage, for comparing the integrated voltage with the second reference voltage to produce the reset signal when the integrated voltage reaches the second reference voltage; and a voltage controlled oscillator, connected to said integrator, said inverter circuit, and said drive voltage control circuit, for oscillating the frequency control signal and the chopping wave signal indicative of the drive frequency which is inversely proportional to a voltage level of the integrated voltage, the drive frequency being equal to the normal lower limit frequency when the integrated voltage is equal to the second reference voltage, the drive frequency being equal to the normal upper limit frequency when the integrated voltage is equal to the lowest voltage.

12. A drive circuit as claimed in claim 8, wherein said drive voltage control circuit comprises:

a rectifying circuit, having a variable resistance ratio and connected to said inverter circuit and said overvoltage protection circuit, for rectifying the first subsidiary drive voltage on the basis of the variable resistance ratio to produce a rectified voltage, said rectifying circuit increasing the variable resistance ratio when said switching signal is present, thereby making the rectified voltage high;

an integrating circuit, connected to said rectifying circuit and having a cell voltage, for integrating a voltage difference between the rectified voltage and the cell voltage to produce an integrated voltage;

a comparator, connected to said integrating circuit and said frequency control circuit, for comparing the chopping wave signal with the integrated voltage to produce a comparison result signal, said comparator producing the comparison result signal having a logic "H" level when the integrated voltage is higher than the chopping wave signal, said comparator producing the comparison result signal having a logic "L" level when the integrated voltage is lower than the chopping wave signal;

a power transistor having a control electrode supplied the comparison result signal, an input electrode supplied with the DC power source voltage, and an output electrode producing the input DC voltage, said power transistor being turned off when the comparison result signal has the logic "H" level, said power transistor being turned on when the comparison result signal has the logic "L" level; and a diode having a cathode connected to the output electrode and an anode which is grounded.

13. A drive circuit as claimed in claim 12, wherein said power transistor is a P-channel power MOSFET having gate, source, and drain electrodes which are operable as the control, the input, and the output electrodes, respectively.

14. A drive circuit as claimed in claim 8, wherein said said overvoltage protection circuit comprises:

a potential divider circuit, having a resistor ratio and connected to the secondary electrode of said piezoelectric transformer, for dividing the output AC voltage in accordance with the resistor ratio to produce a divided AC voltage;

a rectifying circuit, connected to said potential divider circuit, for rectifying the divided AC voltage into a DC voltage; and a comparator, supplied with a reference voltage and connected to said rectifying circuit, said frequency control circuit, and said drive voltage control circuit, for comparing the DC voltage with the reference voltage, said comparator supplying said frequency control circuit and said drive voltage control circuit with the additional reset signal and the switching signal, respectively, when the DC voltage is higher than the reference voltage.

15. A drive circuit for driving a piezoelectric transformer acting as a main transformer, said piezoelectric transformer having a resonance frequency, said piezoelectric transformer having first and second primary electrodes supplied with an input AC voltage, said piezoelectric transformer converting the input AC voltage into an output AC voltage by the use of piezoelectric effect, said piezoelectric transformer having a secondary electrode for supplying the output AC voltage to a load, said drive circuit comprising:

an inverter circuit, supplied with an input DC voltage having controllable input power and with a frequency control signal and connected to the first and the second primary electrodes of said piezoelectric transformer, for converting the input DC voltage into a main drive voltage in response to the frequency control signal, said inverter circuit supplying the first and the second primary electrodes of said piezoelectric transformer with the main drive voltage as the input AC voltage, said inverter circuit including first and second subsidiary transformers supplied with first and second subsidiary drive voltages, respectively;

a frequency control circuit, supplied with a load current flowing in the load as a feedback current, for controlling a drive frequency of said piezoelectric transformer in response to the feedback current, said frequency control circuit having a normal frequency sweeping range defined between a normal upper limit frequency and a normal lower limit frequency, the normal frequency sweeping range including the resonance frequency, said frequency control circuit sweeping the drive frequency within the normal frequency sweeping range, said frequency control circuit being reset in response to a reset signal to shift the drive frequency from the normal lower limit frequency to the normal upper limit frequency, said frequency control circuit producing the frequency control signal and a chopping wave signal which indicate the drive frequency;

a drive voltage control circuit, supplied with a DC power source voltage and connected to said inverter circuit and said frequency control circuit, for controlling, in response to the chopping wave signal and the first subsidiary drive voltage, the input power of the input DC voltage so as to keep the first subsidiary drive voltage at a predetermined peak value; and an overvoltage protection circuit, connected to the secondary electrode of said piezoelectric transformer, said frequency control circuit, and said drive voltage control circuit, for detecting overvoltage in the output AC voltage, said overvoltage protection circuit supplying, on detection of the overvoltage in the output AC voltage, said frequency control circuit with both of an additional reset signal and a switching signal and supplying said drive voltage control circuit with the switching signal, thereby making said frequency control circuit switch from the normal frequency sweeping range to a provisional frequency sweeping range defined between a provisional upper limit frequency lower than the normal upper limit frequency and a provisional lower limit frequency higher than the resonance frequency and making said drive voltage control circuit decrease the input power of the input DC voltage.

16. A drive circuit as claimed in claim 15, wherein said inverter circuit comprises:

a first auto-transformer acting as the first subsidiary transformer, said first auto-transformer having a first primary winding and a first secondary winding which are connected to each other at a first intermediate terminal supplied with the first subsidiary drive voltage, the first primary winding having a first primary terminal supplied with the input DC voltage, the first secondary winding having a first secondary terminal connected to the first primary electrode of said piezoelectric transformer;

a first switching transistor having a first control terminal and a first output terminal for supplying the first subsidiary drive voltage to the first intermediate terminal of said first auto-transformer;

a second auto-transformer acting as the second subsidiary transformer, said second auto-transformer having a second primary winding and a second secondary winding which are connected to each other at a second intermediate terminal supplied with the second subsidiary drive voltage, the second primary winding having a second primary terminal supplied with the input DC voltage, the second secondary winding having a second secondary terminal connected to the second primary electrode of said piezoelectric transformer;

a second switching transistor having a second control terminal and a second output terminal for supplying the second subsidiary drive voltage to the second intermediate terminal of said first auto-transformer; and a two-phase drive circuit, connected to said frequency control circuit and said first and said second switching transistors, for alternately driving, in response to the frequency control signal, said first and said second switching transistors by supplying the first and the second control terminals of said first and said second switching transistors with first and second clock signals which have reversed phase each other.

17. A drive circuit as claimed in claim 16, wherein said first switching transistor is a first N-channel field effect transistor having a first gate electrode serving as the first control terminal, a first drain electrode serving as the first output terminal, the first drain electrode producing a first drain voltage as the first subsidiary drive voltage, and a first source electrode which is grounded, said second switching transistor being a second N-channel field effect transistor having a second gate electrode serving as the second control terminal, a second drain electrode serving as the second output terminal, the second drain electrode producing a second drain voltage as the second subsidiary drive voltage, and a second source electrode which is grounded.

18. A drive circuit as claimed in claim 15, wherein said frequency control circuit comprises:

a current/voltage conversion circuit, connected to the load, for converting the feedback current into a feedback voltage;

a rectifying circuit, connected to said current/voltage conversion circuit, for rectifying the feedback voltage to produce a DC voltage;

a first comparator, connected to said rectifying circuit and supplied with a first reference voltage, for comparing the DC voltage with the first reference voltage to produce a first comparison result signal;

an integrator, having the lowest voltage as an initial voltage and connected to said first comparator and said overvoltage protection circuit, for carrying out integration operation in response to the first comparison result signal to produce an integrated voltage which becomes gradually high during the first comparison result signal indicates that the DC voltage is lower than the first reference voltage, said integrator being reset in response to the reset signal and the additional reset signal to produce the lowest voltage as the integrated voltage;

a second comparator, connected to said integrator and supplied with a second reference voltage higher than the lowest voltage, for comparing the integrated voltage with the second reference voltage to produce the reset signal when the integrated voltage reaches the second reference voltage; and a voltage controlled oscillator, connected to said integrator, said inverter circuit, and said drive voltage control circuit, for oscillating the frequency control signal and the chopping wave signal indicative of the drive frequency which is inversely proportional to a voltage level of the integrated voltage, the drive frequency being equal to the normal lower limit frequency when the integrated voltage is equal to the second reference voltage, the drive frequency being equal to the normal upper limit frequency when the integrated voltage is equal to the lowest voltage in a case where the switching signal is absent, the drive frequency being equal to the provisional upper limit frequency when the integrated voltage is equal to the lowest voltage in a case where the switching signal is present.

19. A drive circuit as claimed in claim 15, wherein said drive voltage control circuit comprises:

a rectifying circuit, having a variable resistance ratio and connected to said inverter circuit and said overvoltage protection circuit, for rectifying the first subsidiary drive voltage on the basis of the variable resistance ratio to produce a rectified voltage, said rectifying circuit increasing the variable resistance ratio when said switching signal is present, thereby making the rectified voltage high;

an integrating circuit, connected to said rectifying circuit and having a cell voltage, for integrating a voltage difference between the rectified voltage and the cell voltage to produce an integrated voltage;

a comparator, connected to said integrating circuit and said frequency control circuit, for comparing the chopping wave signal with the integrated voltage to produce a comparison result signal, said comparator producing the comparison result signal having a logic "H" level when the integrated voltage is higher than the chopping wave signal, said comparator producing the comparison result signal having a logic "L" level when the integrated voltage is lower than the chopping wave signal;

a power transistor having a control electrode supplied the comparison result signal, an input electrode supplied with the DC power source voltage, and an output electrode producing the input DC voltage, said power transistor being turned off when the comparison result signal has the logic "H" level, said power transistor being turned on when the comparison result signal has the logic "L" level; and a diode having a cathode connected to the output electrode and an anode which is grounded.

20. A drive circuit as claimed in claim 19, wherein said power transistor is a P-channel power MOSFET having gate, source, and drain electrodes which are operable as the control, the input, and the output electrodes, respectively.

21. A drive circuit as claimed in claim 15, wherein said said overvoltage protection circuit comprises:

a potential divider circuit, having a resistor ratio and connected to the secondary electrode of said piezoelectric transformer, for dividing the output AC voltage in accordance with the resistor ratio to produce a divided AC voltage;

a rectifying circuit, connected to said potential divider circuit, for rectifying the divided AC voltage into a DC voltage; and a comparator, supplied with a reference voltage and connected to said rectifying circuit, said frequency control circuit, and said drive voltage control circuit, for comparing the DC voltage with the reference voltage, said comparator supplying said frequency control circuit with both of the additional reset signal and the switching signal and supplying said drive voltage control circuit with the switching signal, when the DC voltage is higher than the reference voltage.

\* \* \* \* \*